US012245408B2

(12) United States Patent
Bender et al.

(10) Patent No.: US 12,245,408 B2
(45) Date of Patent: Mar. 4, 2025

(54) MOTOR CONTROLLER HEAT DISSIPATING SYSTEMS AND METHODS

(71) Applicant: Lyft, Inc., San Francisco, CA (US)

(72) Inventors: Adam Christopher Bender, Mountain View, CA (US); Nikola Popov, Burlingame, CA (US); Chen-Yu Lin, Santa Clara, CA (US)

(73) Assignee: Lyft, Inc., San Francisco, CA (US)

(*) Notice: Subject to any disclaimer, the term of this patent is extended or adjusted under 35 U.S.C. 154(b) by 1086 days.

(21) Appl. No.: 16/825,821

(22) Filed: Mar. 20, 2020

(65) Prior Publication Data
US 2021/0296202 A1  Sep. 23, 2021

(51) Int. Cl.
*H05K 7/20* (2006.01)
*B60W 10/08* (2006.01)
(Continued)

(52) U.S. Cl.
CPC .......... *H05K 7/209* (2013.01); *H01L 23/34* (2013.01); *H01L 23/3675* (2013.01);
(Continued)

(58) Field of Classification Search
CPC .......... H05K 7/2039; H05K 7/20454; H05K 7/20463; H05K 7/205; H05K 7/20845;
(Continued)

(56) References Cited

U.S. PATENT DOCUMENTS 6,206,728 B1 * 3/2001 Krehbiel ............ H05K 9/0018
439/939
6,816,377 B2 * 11/2004 Itabashi ............ H05K 7/205
361/690

(Continued)

FOREIGN PATENT DOCUMENTS

JP         2019197855 A  * 11/2019  ............ F23N 1/022
WO   WO-2012163789 A1 * 12/2012  ............ B62H 5/00
(Continued)

OTHER PUBLICATIONS

Machine translation completed Sep. 21, 2023, WO 2018/193827 by Bei et al. (Year: 2023).*

*Primary Examiner* — Zachary Pape
*Assistant Examiner* — Steven Ngo
(74) *Attorney, Agent, or Firm* — Baker Botts L.L.P.

(57) ABSTRACT

A micromobility transit vehicle may include a wheel, an electric motor associated with the wheel, and a motor controller configured to control a motive force provided by the electric motor to the wheel. The motor controller may include a printed circuit board (PCB), one or more MOSFETs attached to the PCB, and a respective aperture defined through the PCB below each MOSFET. The motor controller may include a thermal assembly associated with each MOSFET and capable of dissipating heat from the MOSFETs to a heat sink. Each thermal assembly may include a heat transfer plug positioned at least partially within an associated aperture of the PCBA to contact an associated MOSFET, and a thermal interface material positioned between the heat transfer plug and the heat sink and capable of dissipating heat from the heat transfer plug to the heat sink.

20 Claims, 12 Drawing Sheets

(51) Int. Cl.
*H01L 23/34* (2006.01)
*H01L 23/367* (2006.01)
*H05K 1/02* (2006.01)

(52) U.S. Cl.
CPC ............. *H05K 1/021* (2013.01); *B60W 10/08* (2013.01); *H05K 1/0204* (2013.01); *H05K 7/20454* (2013.01); *H05K 7/205* (2013.01); *H05K 2201/066* (2013.01); *H05K 2201/09063* (2013.01); *H05K 2201/09072* (2013.01); *H05K 2201/09545* (2013.01); *H05K 2201/10416* (2013.01); *H05K 2201/10666* (2013.01)

(58) Field of Classification Search
CPC .. H05K 7/20854; H05K 7/2089; H05K 7/209; H05K 1/02; H05K 1/0201; H05K 1/0203; H05K 1/0204; H05K 1/021; H05K 2201/09545; H05K 2201/10666; H01L 23/36; H01L 23/367; H01L 23/3675; H01L 23/373; H01L 23/3736; B60W 10/08

See application file for complete search history.

(56) References Cited

U.S. PATENT DOCUMENTS

| | | | |
|---|---|---|---|
| 9,444,310 B2* | 9/2016 | Tsuboi | H02K 9/227 |
| 9,444,393 B2* | 9/2016 | Akao | H02P 31/00 |
| 10,232,906 B2* | 3/2019 | Bieler | B62H 5/00 |
| 11,910,518 B2* | 2/2024 | Milyavsky | H01L 23/4093 |
| 2008/0136732 A1* | 6/2008 | O'Connell | H01Q 1/38 |
| | | | 156/60 |
| 2015/0319886 A1* | 11/2015 | Albrecht, III | H05K 1/144 |
| | | | 361/709 |
| 2019/0394883 A1* | 12/2019 | Kresge | H05K 3/3436 |

FOREIGN PATENT DOCUMENTS

| | | | | |
|---|---|---|---|---|
| WO | WO-2018193827 A1 * | 10/2018 | | H05K 1/0204 |
| WO | WO-2018193828 A1 * | 10/2018 | | H01R 4/58 |
| WO | WO-2019116880 A1 * | 6/2019 | | H01L 23/047 |

* cited by examiner

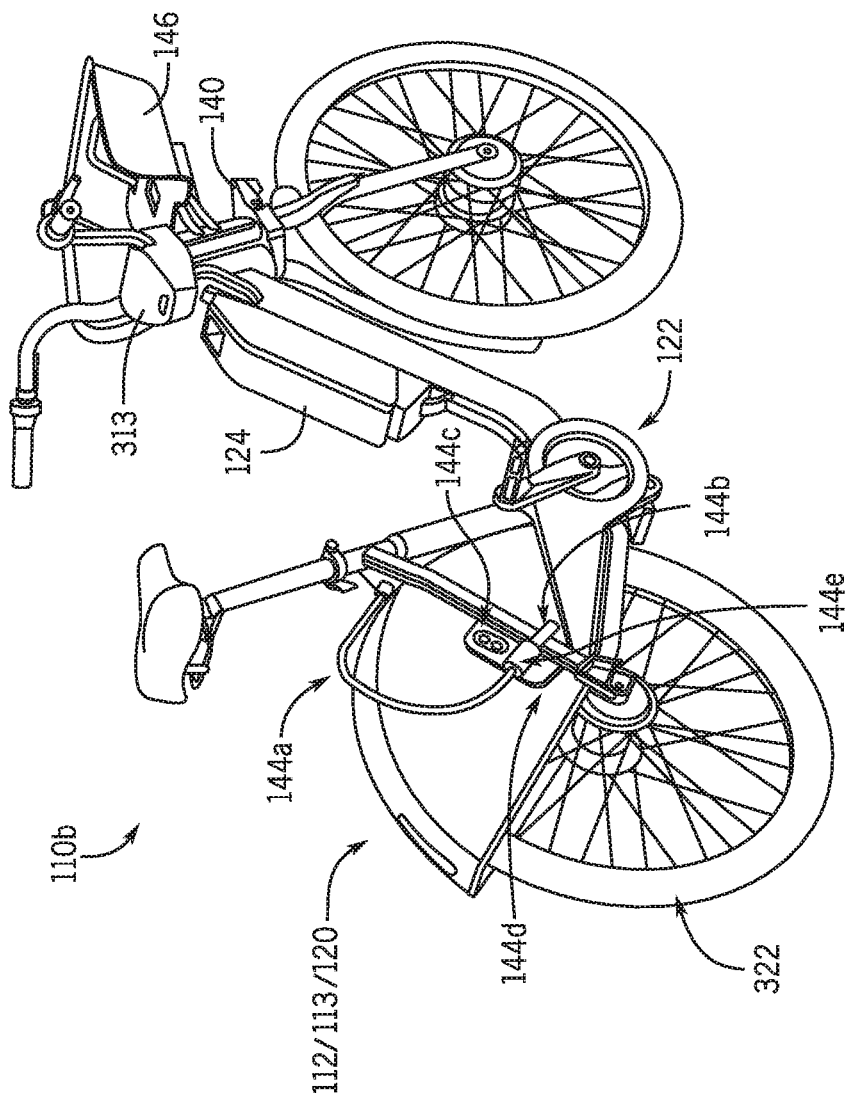

MOTOR CONTROLLER HEAT DISSIPATING SYSTEMS AND METHODS

TECHNICAL FIELD

One or more embodiments of the present disclosure relate generally to micromobility transit vehicles and more particularly, for example, to systems and methods for dissipating heat generated by a motor controller of the micromobility transit vehicle to a heat sink.

BACKGROUND

Heat generated within one or more electrical components of a micromobility vehicle (e.g., scooter, sit-scooter, bicycle, etc.) may need to be dissipated to keep the electrical components operating within a safe range or within manufacturer recommended limits. For example, a micromobility vehicle may include a motor controller configured to control propulsion of the micromobility vehicle via one or more metal-oxide-semiconductor field-effect transistors (MOSFETs). During operation of the micromobility vehicle, heat generated in the MOSFETs of the motor controller may not be effectively or efficiently dissipated from the MOSFETs, leading to shorter lifetimes for the MOSFETs, possible electronic failure, and/or a potential fire hazard.

Therefore, there is a need in the art for systems and methods for efficiently dissipating heat generated by a motor controller of a micromobility transit vehicle that addresses the deficiencies noted above, other deficiencies known in the industry, or at least offers an alternative to current techniques. For example, improvements are needed to better conduct heat out of one or more MOSFETs of a motor controller to a heat sink.

SUMMARY

Techniques are disclosed for systems and methods associated with dissipating heat generated by a motor controller of a micromobility transit vehicle to a heat sink. In accordance with one or more embodiments, a micromobility transit vehicle may include a motor controller including a printed circuit board (PCB), a metal-oxide-semiconductor field-effect transistor (MOSFET) attached to the PCB, and an aperture defined through the PCB below the MOSFET. The motor controller may include a heat transfer plug positioned at least partially within the aperture of the PCB to contact the MOSFET, a heat sink, and a thermal interface material (TIM) positioned between the heat transfer plug and the heat sink. Heat may dissipate from the MOSFET to the heat transfer plug through direct contact of the heat transfer plug with the MOSFET. The TIM may be configured to dissipate heat from the heat transfer plug to the heat sink.

Optionally, the heat transfer plug may include a first portion and a second portion. The first portion may be positioned external to the aperture, the first portion having a first diameter greater than a diameter of the aperture of the PCB. The second portion may extend within the aperture, the second portion having a second diameter less than the diameter of the aperture of the PCB to define an air gap between the PCB and the second portion of the heat transfer plug within the aperture. The first portion of the heat transfer plug may be at least partially attached to the PCB on a side opposite of the MOSFET. The second portion of the heat transfer plug may be positioned within the aperture of the PCB to contact the MOSFET. The aperture of the PCB may be defined by a metal ring extending through the PCB, the first portion of the heat transfer plug attached at least partially to the metal ring. Each of the metal ring and the heat transfer plug may be formed from a copper alloy. Each of the first portion and the second portion of the heat transfer plug may be cylindrically-shaped.

Optionally, the micromobility transit vehicle may include a frame, at least one wheel, and an electric motor associated with the at least one wheel. The motor controller may be configured to control a motive force provided by the electric motor to the at least one wheel. Heat may dissipate from the heat sink to the frame of the micromobility transit vehicle.

In accordance with one or more embodiments, a motor controller may be configured to control a motive force provided by an electric motor to at least one wheel of a micromobility transit vehicle. The motor controller may include a printed circuit board (PCB) having a first side and an opposing second side, a metal-oxide-semiconductor field-effect transistor (MOSFET) attached to the first side of the PCB, an aperture defined through the PCB below the MOSFET, a heat transfer plug at least partially attached to the second side of the PCB and extending through the aperture to contact the MOSFET, a heat sink, and a thermal interface material (TIM) positioned between the heat transfer plug and the heat sink. The TIM may be configured to dissipate heat from the heat transfer plug to the heat sink.

Optionally, the motor controller may include a casing. The PCB may be received within the casing. The heat transfer plug and the TIM may dissipate heat from the MOSFET to the casing. The TIM may electrically isolate the heat transfer plug from the casing. The casing may include one or more surface features for locating the TIM between the heat transfer plug and the casing. The one or more surface features may include one or more raised surfaces defined in the casing. The TIM may be positioned at least partially on the one or more raised surfaces to locate the TIM between the heat transfer plug and the casing. A lid may be attached to the casing that encloses the PCB within the casing. The lid may include an opening and one or more notches within a holder defined adjacent to the opening. One or more connectors attached to the PCB may extend through the opening and attach to a respective notch of the one or more notches of the holder. An attachment element may secure the one or more connectors within the one or more notches of the holder.

Optionally, the heat transfer plug may be configured to increase a heat dissipating capacity between the MOSFET and the heat sink by enlarging a heat dissipating conduit or surface to the heat sink. The heat transfer plug may include a stacked cylinder shape with a first cylindrical portion having a first diameter greater than a diameter of the aperture such that the first cylindrical portion contacts the PCB, and a second cylindrical portion having a second diameter less than the diameter of the aperture such that the second cylindrical portion extends through the aperture to contact the MOSFET and dissipate heat from the MOSFET to the heat transfer plug. The heat transfer plug may be formed from a tin-plated copper alloy.

Optionally, the MOSFET may be configured to control a brake resistor of the micromobility transit vehicle.

In accordance with one or more embodiments, a method may include providing a motor controller configured to control a motive force provided by an electric motor to at least one wheel of a micromobility transit vehicle. The motor controller may include a printed circuit board (PCB), a metal-oxide-semiconductor field-effect transistor (MOSFET) attached to the PCB, and an aperture defined through the PCB below the MOSFET. The method may include positioning a heat transfer plug at least partially within the aperture of the PCB to contact the MOSFET, and dissipating heat from the heat transfer plug to a heat sink through a thermal interface material (TIM) positioned between the heat transfer plug and the heat sink.

Optionally, the motor controller may include a casing having an interior compartment, the PCB positioned within the interior compartment and connected to the casing. Dissipating heat from the heat transfer plug to the heat sink may include dissipating heat from the heat transfer plug to the casing. The method may include dissipating heat from the casing to a frame of the micromobility transit vehicle.

Optionally, positioning the heat transfer plug at least partially within the aperture of the PCB may include positioning a first cylindrical portion of the heat transfer plug against the PCB and positioning a second cylindrical portion of the heat transfer plug within the aperture to contact the MOSFET.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 3A-C illustrate diagrams of micromobility transit vehicles for use in a dynamic transportation matching system in accordance with an embodiment of the disclosure.

Embodiments of the invention and their advantages are best understood by referring to the detailed description that follows. It should be appreciated that like reference numerals are used to identify like elements illustrated in one or more of the figures.

DETAILED DESCRIPTION

In accordance with various embodiments of the present disclosure, micromobility transit vehicles (e.g., kick scooters, sit-scooters, bicycles, etc.) benefit from systems and methods that effectively and efficiently dissipate heat generated by a motor controller to a heat sink. The heat dissipating systems and methods may be implemented using one or more elements, components, or assemblies that dissipate heat from one or more metal-oxide-semiconductor field-effect transistors (MOSFETs), power switches, or other heat generating electronics of the micromobility transit vehicle's motor controller to a heat sink. Heat dissipation from the MOSFETs or other electronic components may occur through a heat transfer plug positioned at least partially within an aperture defined in a printed circuit board below an associated component, and a thermal interface material (TIM) positioned between the heat transfer plug and the heat sink, the TIM capable of dissipating heat from the heat transfer plug to the heat sink.

Figure 1:
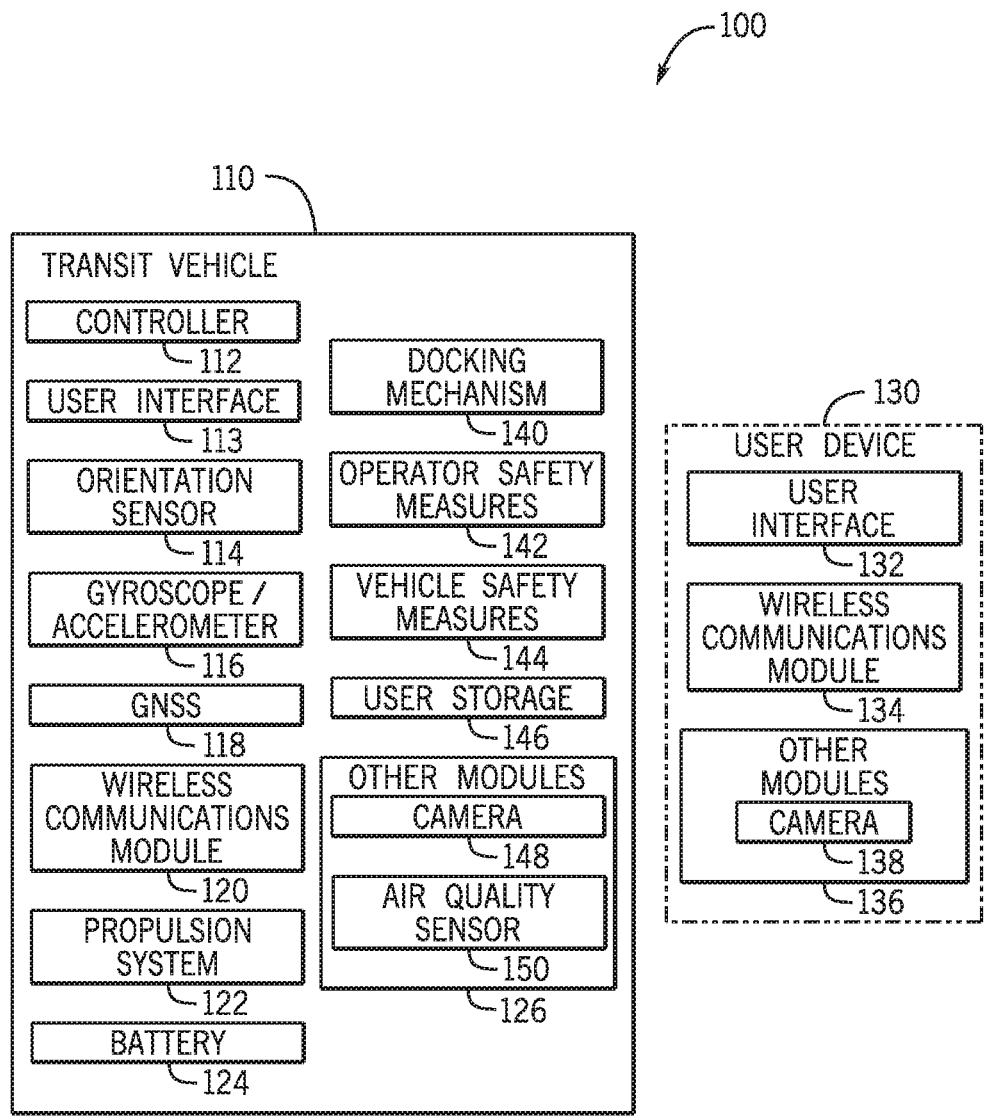
FIG. 1 illustrates a block diagram of a portion of a dynamic transportation matching system including a transit vehicle in accordance with an embodiment of the disclosure.

FIG. 1 illustrates a block diagram of a portion of a dynamic transportation matching system 100 (e.g., system 100) including a transit vehicle 110 in accordance with an embodiment of the disclosure. In the embodiment shown in FIG. 1, system 100 includes transit vehicle 110 and optionally a user device 130. In general, transit vehicle 110 may be a passenger vehicle designed to transport a single user (e.g., a micromobility transit vehicle, a transit bike and scooter vehicle, or the like) or a group of people (e.g., a typical car or truck). More specifically, transit vehicle 110 may be implemented as a motorized or electric kick scooter, bicycle, and/or motor scooter designed to transport one or perhaps two people at once typically on a paved road (collectively, micromobility transit vehicles), as a typical automobile configured to transport up to 4, 7, or 10 people at once, or according to a variety of different transportation modalities (e.g., transportation mechanisms). Transit vehicles similar to transit vehicle 110 may be owned, managed, and/or serviced primarily by a fleet manager/servicer providing transit vehicle 110 for rental and use by the public as one or more types of transportation modalities offered by a dynamic transportation matching system, for example, or may be owned, managed, and/or serviced by a private owner using the dynamic transportation matching system to match their vehicle to a transportation request, such as with ridesharing or ridesourcing applications typically executed on a mobile user device, such as user device 130 as described herein. User device 130 may be a smartphone, tablet, near field communication (NFC) or radio-frequency identification (RFID) enabled smart card, or other personal or portable computing and/or communication device that may be used to facilitate rental and/or operation of transit vehicle 110.

As shown in FIG. 1, transit vehicle 110 may include one or more of a controller 112, a user interface 113, an orientation sensor 114, a gyroscope/accelerometer 116, a global navigation satellite system (GNSS) receiver 118, a wireless communications module 120, a camera 148, a propulsion system 122, an air quality sensor 150, and other modules 126. Operation of transit vehicle 110 may be substantially manual, autonomous, and/or partially or completely controlled by user device 130, which may include one or more of a user interface 132, a wireless communications module 134, a camera 138, and other modules 136. In other embodiments, transit vehicle 110 may include any one or more of the elements of user device 130. In some embodiments, one or more of the elements of system 100 may be implemented in a combined housing or structure that can be coupled to or within transit vehicle 110 and/or held or carried by a user of system 100.

Controller 112 may be implemented as any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a control loop for controlling various operations of transit vehicle 110 and/or other elements of system 100, for example. Such software instructions may also implement methods for processing images and/or other sensor signals or data, determining sensor information, providing user feedback (e.g., through user interface 113 or 132), querying devices for operational parameters, selecting operational parameters for devices, or performing any of the various operations described herein (e.g., operations performed by logic devices of various devices of system 100).

In addition, a non-transitory medium may be provided for storing machine readable instructions for loading into and execution by controller 112. In these and other embodiments, controller 112 may be implemented with other components where appropriate, such as volatile memory, non-volatile memory, one or more interfaces, and/or various analog and/or digital components for interfacing with devices of system 100. For example, controller 112 may be adapted to store sensor signals, sensor information, parameters for coordinate frame transformations, calibration parameters, sets of calibration points, and/or other operational parameters, over time, for example, and provide such stored data to a user via user interface 113 or 132. In some embodiments, controller 112 may be integrated with one or more other elements of transit vehicle 110, for example, or distributed as multiple logic devices within transit vehicle 110 and/or user device 130.

In some embodiments, controller 112 may be configured to substantially continuously monitor and/or store the status of and/or sensor data provided by one or more elements of transit vehicle 110 and/or user device 130, such as the position and/or orientation of transit vehicle 110 and/or user device 130, for example, and the status of a communication link established between transit vehicle 110 and/or user device 130. Such communication links may be established and then provide for transmission of data between elements of system 100 substantially continuously throughout operation of system 100, where such data includes various types of sensor data, control parameters, and/or other data.

User interface 113 of transit vehicle 110 may be implemented as one or more of a display, a touch screen, a keyboard, a mouse, a joystick, a knob, a steering wheel, a yoke, and/or any other device capable of accepting user input and/or providing feedback to a user. In various embodiments, user interface 113 may be adapted to provide user input (e.g., as a type of signal and/or sensor information transmitted by wireless communications module 134 of user device 130) to other devices of system 100, such as controller 112. User interface 113 may also be implemented with one or more logic devices (e.g., similar to controller 112) that may be adapted to store and/or execute instructions, such as software instructions, implementing any of the various processes and/or methods described herein. For example, user interface 113 may be adapted to form communication links, transmit and/or receive communications (e.g., infrared images and/or other sensor signals, control signals, sensor information, user input, and/or other information), for example, or to perform various other processes and/or methods described herein.

In one embodiment, user interface 113 may be adapted to display a time series of various sensor information and/or other parameters as part of or overlaid on a graph or map, which may be referenced to a position and/or orientation of transit vehicle 110 and/or other elements of system 100. For example, user interface 113 may be adapted to display a time series of positions, headings, and/or orientations of transit vehicle 110 and/or other elements of system 100 overlaid on a geographical map, which may include one or more graphs indicating a corresponding time series of actuator control signals, sensor information, and/or other sensor and/or control signals. In some embodiments, user interface 113 may be adapted to accept user input including a user-defined target heading, waypoint, route, and/or orientation, for example, and to generate control signals to cause transit vehicle 110 to move according to the target heading, route, and/or orientation. In other embodiments, user interface 113 may be adapted to accept user input modifying a control loop parameter of controller 112, for example.

Orientation sensor 114 may be implemented as one or more of a compass, float, accelerometer, and/or other device capable of measuring an orientation of transit vehicle 110 (e.g., magnitude and direction of roll, pitch, and/or yaw, relative to one or more reference orientations such as gravity and/or Magnetic North), camera 148, and/or other elements of system 100, and providing such measurements as sensor signals and/or data that may be communicated to various devices of system 100. Gyroscope/accelerometer 116 may be implemented as one or more electronic sextants, semiconductor devices, integrated chips, accelerometer sensors, accelerometer sensor systems, or other devices capable of measuring angular velocities/accelerations and/or linear accelerations (e.g., direction and magnitude) of transit vehicle 110 and/or other elements of system 100 and providing such measurements as sensor signals and/or data that may be communicated to other devices of system 100 (e.g., user interface 132, controller 112).

GNSS receiver 118 may be implemented according to any global navigation satellite system, including a GPS, GLONASS, and/or Galileo based receiver and/or other device capable of determining absolute and/or relative position of transit vehicle 110 (e.g., or an element of transit vehicle 110) based on wireless signals received from space-born and/or terrestrial sources (e.g., eLoran, and/or other at least partially terrestrial systems), for example, and capable of providing such measurements as sensor signals and/or data (e.g., coordinates) that may be communicated to various devices of system 100. In some embodiments, GNSS receiver 118 may include an altimeter, for example, or may be used to provide an absolute altitude.

Wireless communications module 120 may be implemented as any wireless communications module configured to transmit and receive analog and/or digital signals between elements of system 100. For example, wireless communications module 120 may be configured to receive control signals and/or data from user device 130 and provide them to controller 112 and/or propulsion system 122. In other embodiments, wireless communications module 120 may be configured to receive images and/or other sensor information (e.g., still images or video images) and relay the sensor data to controller 112 and/or user device 130. In some embodiments, wireless communications module 120 may be configured to support spread spectrum transmissions, for example, and/or multiple simultaneous communications channels between elements of system 100. Wireless communication links formed by wireless communications module 120 may include one or more analog and/or digital radio communication links, such as WiFi, Bluetooth, NFC, RFID, and others, as described herein, and may be direct communication links established between elements of system 100, for example, or may be relayed through one or more wireless relay stations configured to receive and retransmit wireless communications. In various embodiments, wireless communications module 120 may be configured to support wireless mesh networking, as described herein.

In some embodiments, wireless communications module 120 may be configured to be physically coupled to transit vehicle 110 and to monitor the status of a communication link established between transit vehicle 110 and/or user device 130. Such status information may be provided to controller 112, for example, or transmitted to other elements of system 100 for monitoring, storage, or further processing, as described herein. In addition, wireless communications module 120 may be configured to determine a range to another device, such as based on time of flight, and provide such range to the other device and/or controller 112. Communication links established by communication module 120 may be configured to transmit data between elements of system 100 substantially continuously throughout operation of system 100, where such data includes various types of sensor data, control parameters, and/or other data, as described herein.

Propulsion system 122 may be implemented as one or more motor-based propulsion systems, and/or other types of propulsion systems that can be used to provide motive force to transit vehicle 110 and/or steer transit vehicle 110. In some embodiments, propulsion system 122 may include elements that can be controlled (e.g., by controller 112 and/or user interface 113) to provide motion for transit vehicle 110 and to provide an orientation for transit vehicle 110. In various embodiments, propulsion system 122 may be implemented with a portable power supply, such as a battery and/or a combustion engine/generator and fuel supply.

For example, in some embodiments, such as when propulsion system 122 is implemented by an electric motor (e.g., as with many micromobility transit vehicles), transit vehicle 110 may include battery 124. Battery 124 may be implemented by one or more battery cells (e.g., lithium ion battery cells) and be configured to provide electrical power to propulsion system 122 to propel transit vehicle 110, for example, as well as to various other elements of system 100, including controller 112, user interface 113, and/or wireless communications module 120. In some embodiments, battery 124 may be implemented with its own safety measures, such as thermal interlocks and a fire-resistant enclosure, for example, and may include one or more logic devices, sensors, and/or a display to monitor and provide visual feedback of a charge status of battery 124 (e.g., a charge percentage, a low charge indicator, etc.).

Other modules 126 may include other and/or additional sensors, actuators, communications modules/nodes, and/or user interface devices, for example, and may be used to provide additional environmental information related to operation of transit vehicle 110, for example. In some embodiments, other modules 126 may include a humidity sensor, a wind and/or water temperature sensor, a barometer, an altimeter, a radar system, a proximity sensor, a visible spectrum camera or infrared camera (with an additional mount), and/or other environmental sensors providing measurements and/or other sensor signals that can be displayed to a user and/or used by other devices of system 100 (e.g., controller 112) to provide operational control of transit vehicle 110 and/or system 100. In further embodiments, other modules 126 may include a light, such as a headlight or indicator light, and/or an audible alarm, both of which may be activated to alert passersby to possible theft, abandonment, and/or other critical statuses of transit vehicle 110. In particular, and as shown in FIG. 1, other modules 126 may include camera 148 and/or air quality sensor 150.

Camera 148 may be implemented as an imaging device including an imaging module including an array of detector elements that can be arranged in a focal plane array. In various embodiments, camera 148 may include one or more logic devices (e.g., similar to controller 112) that can be configured to process imagery captured by detector elements of camera 148 before providing the imagery to communications module 120. More generally, camera 148 may be configured to perform any of the operations or methods described herein, at least in part, or in combination with controller 112 and/or user interface 113 or 132.

In various embodiments, air quality sensor 150 may be implemented as an air sampling sensor configured to determine an air quality of an environment about transit vehicle 110 and provide corresponding air quality sensor data. Air quality sensor data provided by air quality sensor 150 may include particulate count, methane content, ozone content, and/or other air quality sensor data associated with common street level sensitivities and/or health monitoring typical when in a street level environment, such as that experienced when riding on a typical micromobility transit vehicle, as described herein.

Transit vehicles implemented as micromobility transit vehicles may include a variety of additional features designed to facilitate fleet management and user and environmental safety. For example, as shown in FIG. 1, transit vehicle 110 may include one or more of docking mechanism 140, operator safety measures 142, vehicle security device 144, and/or user storage 146, as described in more detail herein by reference to FIGS. 3A-C.

User interface 132 of user device 130 may be implemented as one or more of a display, a touch screen, a keyboard, a mouse, a joystick, a knob, a steering wheel, a yoke, and/or any other device capable of accepting user input and/or providing feedback to a user. In various embodiments, user interface 132 may be adapted to provide user input (e.g., as a type of signal and/or sensor information transmitted by wireless communications module 134 of user device 130) to other devices of system 100, such as controller 112. User interface 132 may also be implemented with one or more logic devices (e.g., similar to controller 112) that may be adapted to store and/or execute instructions, such as software instructions, implementing any of the various processes and/or methods described herein. For example, user interface 132 may be adapted to form communication links, transmit and/or receive communications (e.g., infrared images and/or other sensor signals, control signals, sensor information, user input, and/or other information), for example, or to perform various other processes and/or methods described herein.

In one embodiment, user interface 132 may be adapted to display a time series of various sensor information and/or other parameters as part of or overlaid on a graph or map, which may be referenced to a position and/or orientation of transit vehicle 110 and/or other elements of system 100. For example, user interface 132 may be adapted to display a time series of positions, headings, and/or orientations of transit vehicle 110 and/or other elements of system 100 overlaid on a geographical map, which may include one or more graphs indicating a corresponding time series of actuator control signals, sensor information, and/or other sensor and/or control signals. In some embodiments, user interface 132 may be adapted to accept user input including a user-defined target heading, waypoint, route, and/or orientation, for example, and to generate control signals to cause transit vehicle 110 to move according to the target heading, route, and/or orientation. In other embodiments, user interface 132 may be adapted to accept user input modifying a control loop parameter of controller 112, for example.

Wireless communications module 134 may be implemented as any wireless communications module configured to transmit and receive analog and/or digital signals between elements of system 100. For example, wireless communications module 134 may be configured to transmit control signals from user interface 132 to wireless communications module 120 or 144. In some embodiments, wireless communications module 134 may be configured to support spread spectrum transmissions, for example, and/or multiple simultaneous communications channels between elements of system 100. In various embodiments, wireless communications module 134 may be configured to monitor the status of a communication link established between user device 130 and/or transit vehicle 110 (e.g., including packet loss of transmitted and received data between elements of system 100, such as with digital communication links), and/or determine a range to another device, as described herein. Such status information may be provided to user interface 132, for example, or transmitted to other elements of system 100 for monitoring, storage, or further processing, as described herein. In various embodiments, wireless communications module 134 may be configured to support wireless mesh networking, as described herein.

Other modules 136 of user device 130 may include other and/or additional sensors, actuators, communications modules/nodes, and/or user interface devices used to provide additional environmental information associated with user device 130, for example. In some embodiments, other modules 136 may include a humidity sensor, a wind and/or water temperature sensor, a barometer, a radar system, a visible spectrum camera, an infrared camera, a GNSS receiver, and/or other environmental sensors providing measurements and/or other sensor signals that can be displayed to a user and/or used by other devices of system 100 (e.g., controller 112) to provide operational control of transit vehicle 110 and/or system 100 or to process sensor data to compensate for environmental conditions. As shown in FIG. 1, other modules 136 may include camera 138.

Camera 138 may be implemented as an imaging device including an imaging module including an array of detector elements that can be arranged in a focal plane array. In various embodiments, camera 138 may include one or more logic devices (e.g., similar to controller 112) that can be configured to process imagery captured by detector elements of camera 138 before providing the imagery to communications module 120. More generally, camera 138 may be configured to perform any of the operations or methods described herein, at least in part, or in combination with controller 138 and/or user interface 113 or 132.

In general, each of the elements of system 100 may be implemented with any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a method for providing sensor data and/or imagery, for example, or for transmitting and/or receiving communications, such as sensor signals, sensor information, and/or control signals, between one or more devices of system 100.

In addition, one or more non-transitory mediums may be provided for storing machine readable instructions for loading into and execution by any logic device implemented with one or more of the devices of system 100. In these and other embodiments, the logic devices may be implemented with other components where appropriate, such as volatile memory, non-volatile memory, and/or one or more interfaces (e.g., inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces, such as an interface for one or more antennas, or an interface for a particular type of sensor).

Sensor signals, control signals, and other signals may be communicated among elements of system 100 and/or elements of other systems similar to system 100 using a variety of wired and/or wireless communication techniques, including voltage signaling, Ethernet, WiFi, Bluetooth, Zigbee, Xbee, Micronet, Near-field Communication (NFC) or other medium and/or short range wired and/or wireless networking protocols and/or implementations, for example. In such embodiments, each element of system 100 may include one or more modules supporting wired, wireless, and/or a combination of wired and wireless communication techniques, including wireless mesh networking techniques. In some embodiments, various elements or portions of elements of system 100 may be integrated with each other, for example, or may be integrated onto a single printed circuit board (PCB) to reduce system complexity, manufacturing costs, power requirements, coordinate frame errors, and/or timing errors between the various sensor measurements.

Each element of system 100 may include one or more batteries, capacitors, or other electrical power storage devices, for example, and may include one or more solar cell modules or other electrical power generating devices. In some embodiments, one or more of the devices may be powered by a power source for transit vehicle 110, using one or more power leads. Such power leads may also be used to support one or more communication techniques between elements of system 100.

Figure 2:
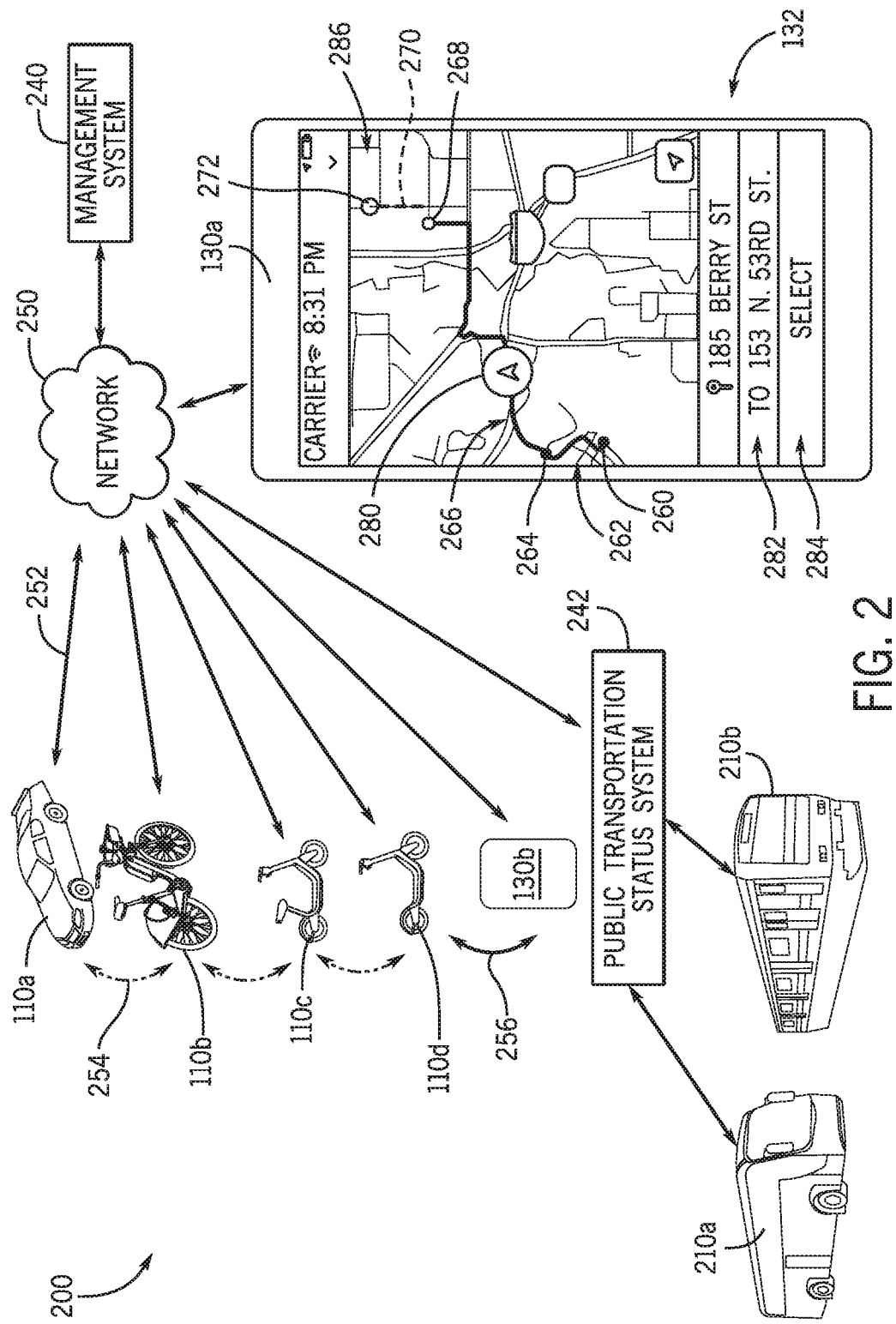
FIG. 2 illustrates a block diagram of a dynamic transportation matching system incorporating a variety of transportation modalities in accordance with an embodiment of the disclosure.

FIG. 2 illustrates a block diagram of a dynamic transportation matching system 200 (or multimodal transportation system) incorporating a variety of transportation modalities in accordance with an embodiment of the disclosure. For example, as shown in FIG. 2, dynamic transportation matching system 200 may include multiple embodiments of system 100. In the embodiment shown in FIG. 2, dynamic transportation matching system 200 includes a management system/server 240 in communication with a number of transit vehicles 110*a*-*d* and user devices 130*a*-*b* over a combination of a typical wide area network (WAN) 250, WAN communication links 252 (solid lines), a variety of mesh network communication links 254 (curved dashed lines), and NFC, RFID, and/or other local communication links 256 (curved solid lines). Dynamic transportation matching system 200 also includes a public transportation status system 242 in communication with a variety of public transportation vehicles, including one or more buses 210*a*, trains 210*b*, and/or other public transportation modalities, such as ships, ferries, light rail, subways, streetcars, trolleys, cable cars, monorails, tramways, and aircraft. As shown in FIG. 2, all transit vehicles are able to communicate directly to WAN 250 and, in some embodiments, may be able to communicate across mesh network communication links 254, to convey fleet data and/or fleet status data amongst themselves and/or to and from management system 240.

In FIG. 2, a requestor may use user device 130a to hire or rent one of transit vehicles 110a-d by transmitting a transportation request to management system 240 over WAN 250, allowing management system 240 to poll status of transit vehicles 110a-d and to select one of transit vehicles 110a-d to fulfill the transportation request; receiving a fulfillment notice from management system 240 and/or from the selected transit vehicle, and receiving navigation instructions to proceed to or otherwise meet with the selected transit vehicle. A similar process may be used by a requestor using user device 130b, but where the requestor is able to enable a transit vehicle over a local communication link 256, as shown.

Management system 240 may be implemented as a server with controllers, user interfaces, communications modules, and/or other elements similar to those described with respect to system 100 of FIG. 1, but with sufficient processing and storage resources to manage operation of dynamic transportation matching system 200, including monitoring statuses of transit vehicles 110a-d, as described herein. In some embodiments, management system 240 may be implemented in a distributed fashion and include multiple separate server embodiments linked communicatively to each other direction and/or through WAN 250. WAN 250 may include one or more of the Internet, a cellular network, and/or other wired or wireless WANs. WAN communication links 252 may be wired or wireless WAN communication links, and mesh network communication links 254 may be wireless communication links between and among transit vehicles 110a-d, as described herein.

User device 130a in FIG. 2 includes a display of user interface 132 that shows a planned route for a user attempting to travel from an origination point 260 to a destination 272 using different transportation modalities (e.g., a planned multimodal route), as depicted in a route/street map 286 rendered by user interface 132. For example, management system 240 may be configured to monitor statuses of all available transportation modalities (e.g., including transit vehicles and public transportation vehicles) and provide a planned multimodal route from origination point 260 to destination 272. Such a planned multimodal route may include, for example, a walking route 262 from origination point 260 to a bus stop 264, a bus route 266 from bus stop 264 to a bus stop 268, and a micromobility route 270 (e.g., using one of micromobility transit vehicles 110b, 110c, or 110d) from bus stop 268 to destination 272. Also shown rendered by user interface 132 are a present location indicator 280 (indicating a present absolute position of user device 130a on street map 286), a navigation destination selector/indicator 282 (e.g., configured to allow a user to input a desired navigation destination), and a notice window 284 (e.g., used to render fleet status data, including user notices and/or alerts, as described herein). For example, a user may use navigation destination selector/indicator 282 to provide and/or change destination 272, as well as change any leg or modality of the multimodal route from origination point 260 to destination 272. In some embodiments, notice window 284 may display instructions for traveling to a next waypoint along the determined multimodal route (e.g., directions to walk to a bus stop, directions to ride a micromobility transit vehicle to a next stop along the route, etc.).

In various embodiments, management system 240 may be configured to provide or suggest an optimal multimodal route to a user (e.g., initially and/or while traversing a particular planned route), and a user may select or make changes to such a route through manipulation of user device 130a, as shown. For example, management system 240 may be configured to suggest a quickest route, a least expensive route, a most convenient route (to minimize modality changes or physical actions a user must take along the route), an inclement weather route (e.g., that keeps the user protected from inclement weather a maximum amount of time during route traversal), or some combination of those that is determined as best suited to the user, such as based on various user preferences. Such preferences may be based on prior use of system 200, prior user trips, a desired arrival time and/or departure time (e.g., based on user input or obtained through a user calendar or other data source), or specifically input or set by a user for the specific route, for example, or in general. In one example, origination point 260 may be extremely congested or otherwise hard to access by a ride-share transit vehicle, which could prevent or significantly increase a wait time for the user and a total trip time to arrive at destination 272. In such circumstances, a planned multimodal route may include directing the user to walk and/or take a scooter/bike to an intermediate and less congested location to meet a reserved ride-share vehicle, which would allow the user to arrive at destination 272 quicker than if the ride-share vehicle was forced to meet the user at origination point 260. It will be appreciated that numerous different transportation-relevant conditions may exist or dynamically appear or disappear along a planned route that may make it beneficial to use different modes of transportation to arrive at destination 272 efficiently, including changes in traffic congestion and/or other transportation-relevant conditions that occur mid-route, such as an accident along the planned route. Under such circumstances, management system 240 may be configured to adjust a modality or portion of the planned route dynamically in order to avoid or otherwise compensate for the changed conditions while the route is being traversed.

Figure 3B:
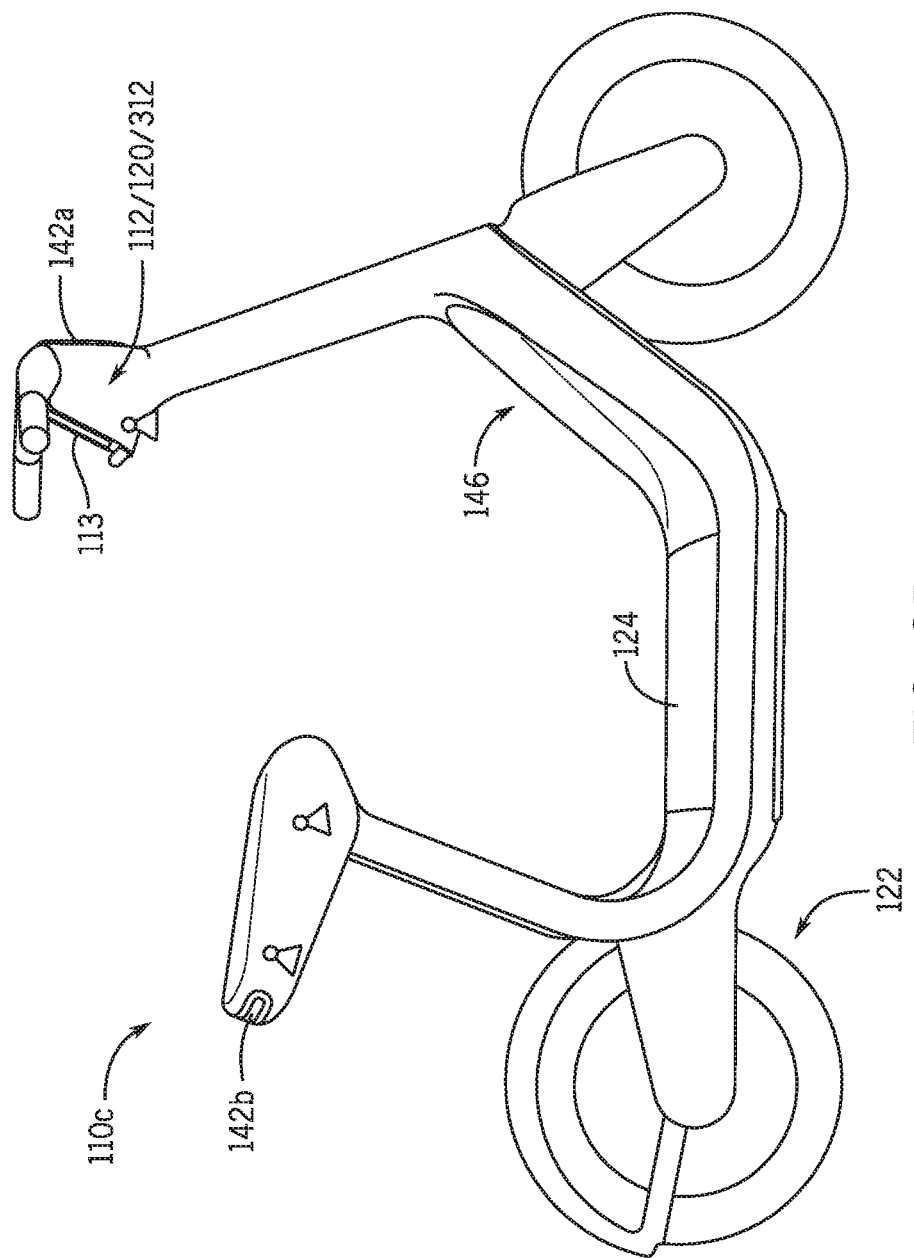
Figure 3C:
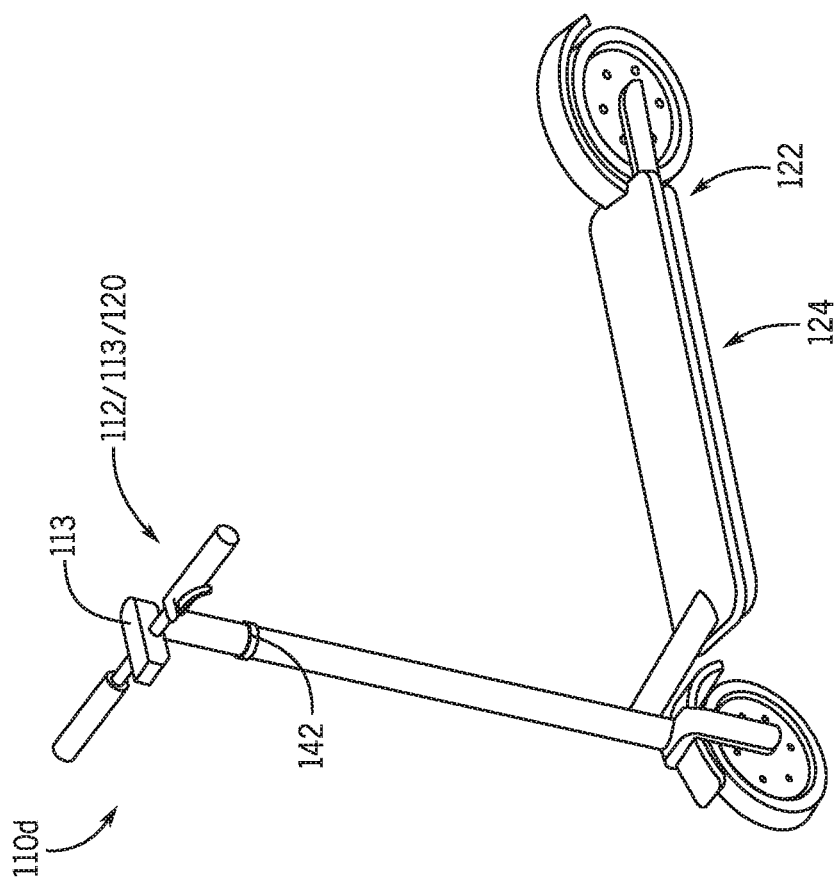

FIGS. 3A-C illustrate diagrams of micromobility transit vehicles 110b, 110c, and 110d, which may be integrated network systems in accordance with an embodiment of the disclosure. For example, transit vehicle 110b of FIG. 3A may correspond to a motorized bicycle for hire that is integrated with the various elements of system 100 and may be configured to participate in dynamic transportation matching system 200 of FIG. 2. As shown, transit vehicle 110b includes controller/user interface/wireless communications module 112/113/120 (e.g., integrated with a rear fender of transit vehicle 110b), propulsion system 122 configured to provide motive power to at least one of the wheels (e.g., a rear wheel 322) of transit vehicle 110b, battery 124 for powering propulsion system 122 and/or other elements of transit vehicle 110b, docking mechanism 140 (e.g., a spade lock assembly) for docking transit vehicle 110b at a docking station, user storage 146 implemented as a handlebar basket, and vehicle security device (e.g., an embodiment of vehicle security device 144 of FIG. 1), which may incorporate one or more of a locking cable 144a, a pin 144b coupled to a free end of locking cable 144a, a pin latch/insertion point 144c, a frame mount 144d, and a cable/pin holster 144e, as shown (collectively, vehicle security device 144). In some embodiments, controller/user interface/wireless communications module 112/113/120 may alternatively be integrated on and/or within a handlebar enclosure 313, as shown.

In some embodiments, vehicle security device 144 may be implemented as a wheel lock configured to immobilize rear wheel 322 of transit vehicle 110*b*, such as by engaging pin 144*b* with spokes of rear wheel 322. In the embodiment shown in FIG. 3A, vehicle security device 144 may be implemented as a cable lock configured to engage with a pin latch on a docking station, for example, or to wrap around and/or through a secure pole, fence, or bicycle rack and engage with pin latch 144*c*. In various embodiments, vehicle security device 144 may be configured to immobilize transit vehicle 110*b* by default, thereby requiring a user to transmit a hire request to management system 240 (e.g., via user device 130) to hire transit vehicle 110*b* before attempting to use transit vehicle 110*b*. The hire request may identify transit vehicle 110*b* based on an identifier (e.g., a QR code, a barcode, a serial number, etc.) presented on transit vehicle 110*b* (e.g., such as by user interface 113 on a rear fender of transit vehicle 110*b*). Once the hire request is approved (e.g., payment is processed), management system 240 may transmit an unlock signal to transit vehicle 110*b* (e.g., via network 250). Upon receiving the unlock signal, transit vehicle 110*b* (e.g., controller 112 of transit vehicle 110*b*) may release vehicle security device 144 and unlock rear wheel 322 of transit vehicle 110*b*.

Transit vehicle 110*c* of FIG. 3B may correspond to a motorized sit-scooter for hire that is integrated with the various elements of system 100 and may be configured to participate in dynamic transportation matching system 200 of FIG. 2. As shown in FIG. 3B, transit vehicle 110*c* includes many of the same elements as those discussed with respect to transit vehicle 110*b* of FIG. 3A. For example, transit vehicle 110*c* may include user interface 113, propulsion system 122, battery 124, controller/wireless communications module/cockpit enclosure 112/120/312, user storage 146 (e.g., implemented as a storage recess), and operator safety measures 142*a* and 142*b*, which may be implemented as various types of headlights, programmable light strips, and/or reflective strips.

Transit vehicle 110*d* of FIG. 3C may correspond to a motorized stand or kick scooter for hire that is integrated with the various elements of system 100 and may be configured to participate in dynamic transportation matching system 200 of FIG. 2. As shown in FIG. 3C, transit vehicle 110*d* includes many of the same elements as those discussed with respect to transit vehicle 110*b* of FIG. 3A. For example, transit vehicle 110*d* may include user interface 113, propulsion system 122, battery 124, controller/wireless communications module/cockpit enclosure 112/120/312, and operator safety measures 140, which may be implemented as various types programmable light strips and/or reflective strips, as shown.

Figure 3D:
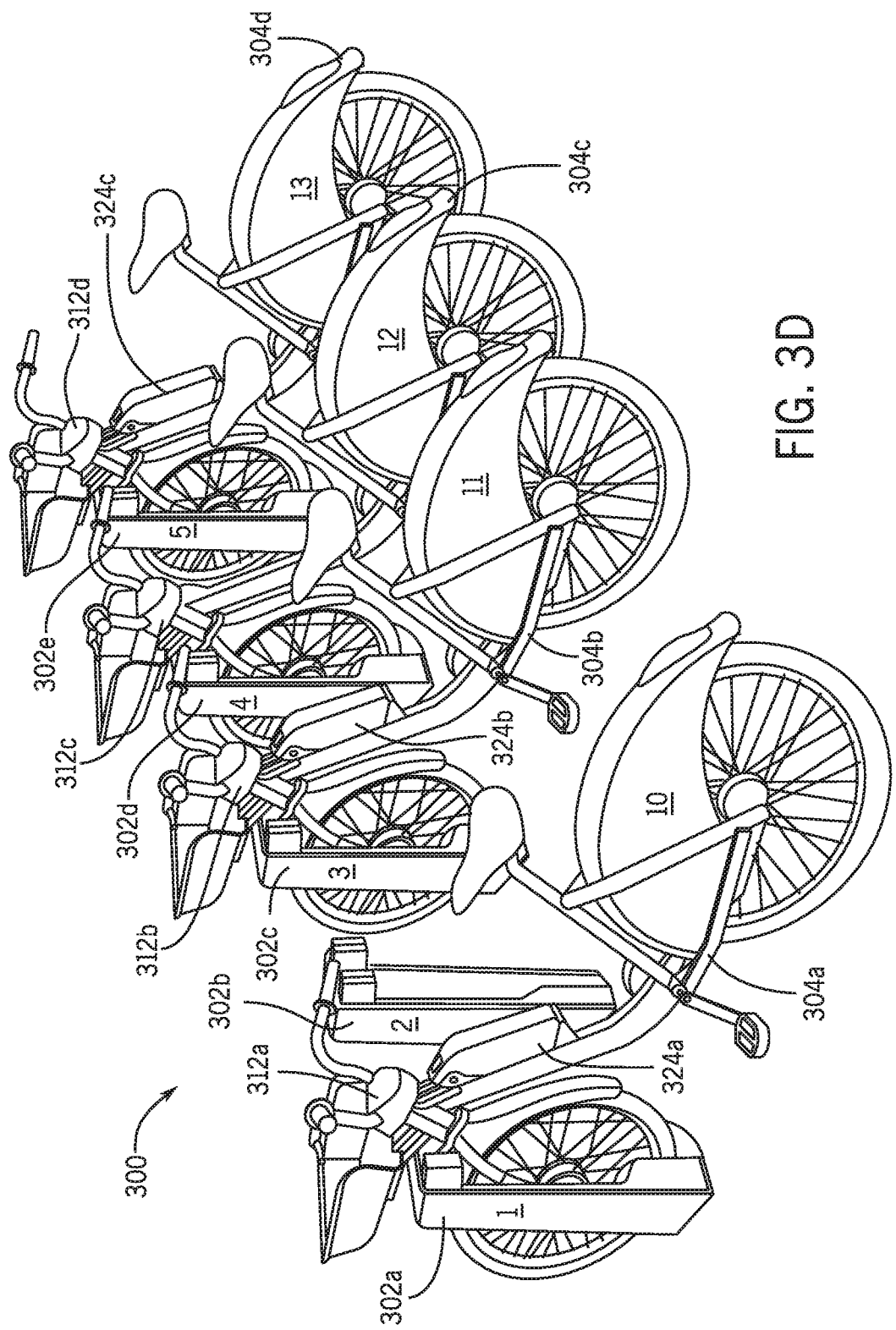
FIG. 3D illustrates a diagram of a docking station for docking micromobility transit vehicles in accordance with an embodiment of the disclosure.

FIG. 3D illustrates a docking station 300 for docking transit vehicles (e.g., transit vehicles 110*c*, 110*e*, and 110*g*, etc.) according to one embodiment. As shown, docking station 300 may include multiple bicycle docks, such as docks 302*a-e*. In this example, a single transit vehicle (e.g., any one of electric bicycles 304*a-d*) may dock in each of the docks 302*a-e* of the docking station 300. Each of the docks 302*a-e* may include a lock mechanism for receiving and locking docking mechanism 140 of the electric bicycles 304*a-d*. In some embodiments, once a transit vehicle is docked in a bicycle dock, the dock may be electronically coupled to the transit vehicle (e.g., controllers 312*a-d* of the transit vehicle) via a link such that the transit vehicle and the dock may communicate with each other via the link.

A user may use a user device (e.g., user device 130) to hire a transit vehicle that is docked in one of the bicycle docks 302*a-e* by transmitting a hire request to management system 240. Once the hire request is processed, management system 240 may transmit an unlock signal to the electric bicycle docked in the dock and/or the dock via network 250. The dock may automatically unlock the lock mechanism to release the electric bicycle based on the unlock signal. In some embodiments, each of the docks 302*a-e* may also be configured to charge batteries (e.g., batteries 324*a-c*) of the electric bicycle 304*a-d*, respectively, when the electric bicycle 304*a-d* are docked at the docks 302*a-e*. In some embodiments, docking station 300 may also be configured to transmit information associated with the docking station 300 (e.g., a number of transit vehicles docked at the docking station 300, charge statuses of the docked transit vehicles, etc.) to the management system 240.

Figure 4:
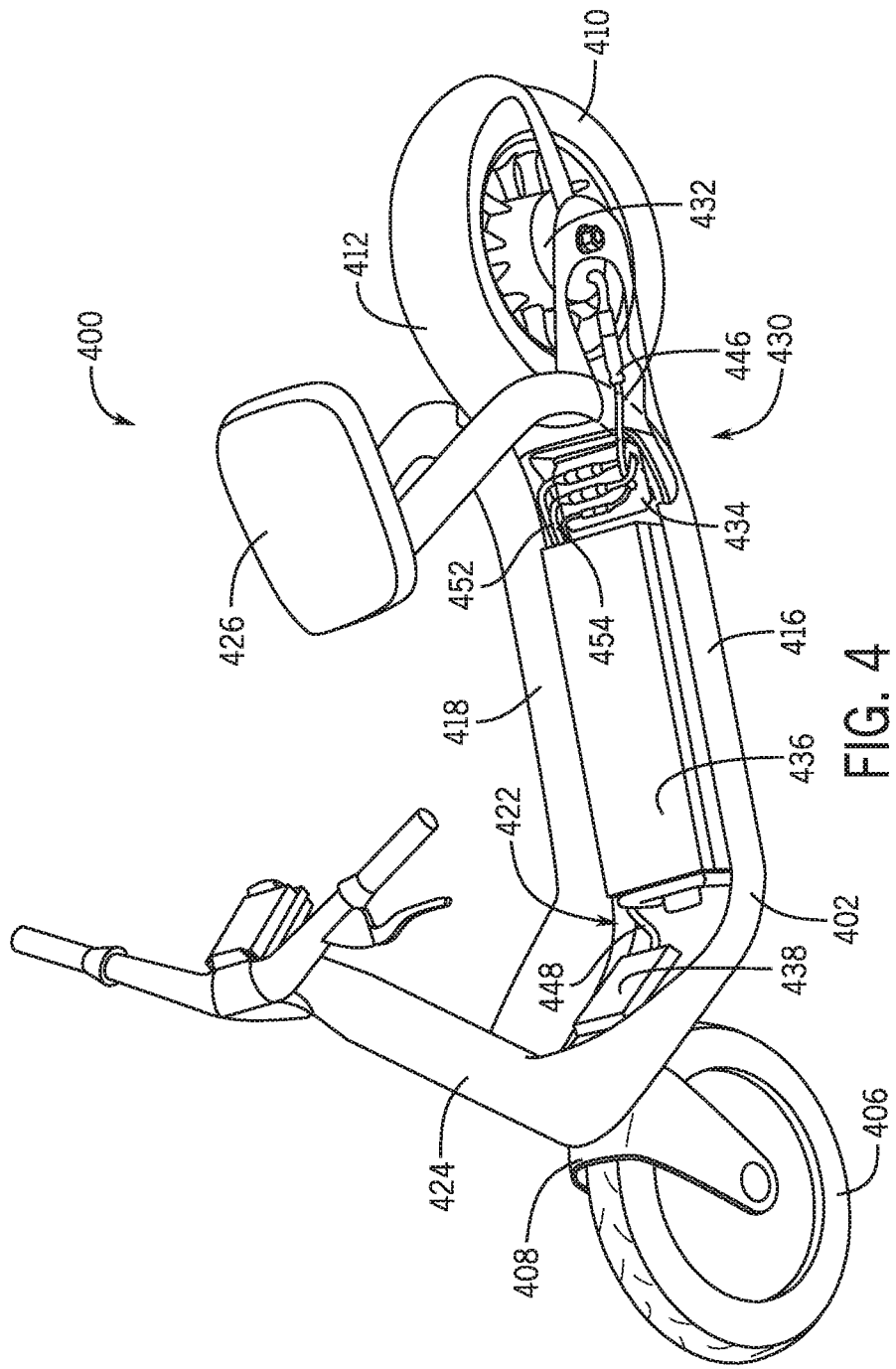
FIG. 4 illustrates a diagram of a micromobility transit vehicle in accordance with an embodiment of the disclosure.

FIG. 4 illustrates a diagram of a micromobility transit vehicle 400 in accordance with an embodiment of the disclosure. In the illustrated embodiment, the micromobility transit vehicle 400 is a two-wheeled sit-scooter, although other configurations are contemplated, including bicycles, kick scooters, and the like (e.g., fleet vehicles 110 and 110*a-d*, described above). As shown, the micromobility transit vehicle 400 includes a frame 402 and at least one wheel coupled to the frame 402. For example, the micromobility transit vehicle 400 may include a front wheel 406 coupled to the frame 402 via a front fork 408 and a rear wheel 410 coupled to the frame 402 via a rear fork or triangle 412. The frame 402 may include many configurations. For example, the frame 402 may include a first frame member 416 and a second frame member 418 extending along opposing sides of the micromobility transit vehicle 400 in a spaced relationship. In such embodiments, a vehicle frame space 422 may be defined between the first frame member 416 and the second frame member 418. One end of each of the first frame member 416 and the second frame member 418 may be connected to a head tube 424. The other end of each of the first frame member 416 and the second frame member 418 may be connected, directly or indirectly, to a seat 426 of the micromobility transit vehicle 400.

As shown, the micromobility transit vehicle 400 includes a power system 430 that provides a motive force to at least one wheel, such as the rear wheel 410, to propel the micromobility transit vehicle 400 across a surface (e.g., a road surface, a sidewalk, a path, a trail, etc.). The power system 430 may be similar to the propulsion system 122 described above. For instance, the power system 430 includes an electric motor 432 coupled to at least one wheel (e.g., the rear wheel 410) and a motor controller 434 electronically coupled to the electric motor 432 to control a motive force provided by the electric motor 432 to the at least one wheel. The power system 430 also includes a battery 436 electronically coupled to the motor, such as via the motor controller 434, to provide electric power to the electric motor 432. In some embodiments, the micromobility transit vehicle 400 may include a brake resistor 438 electronically coupled to the motor controller 434. In such embodiments, the motor controller 434 may electronically couple the brake resistor 438 to the electric motor 432. Each component of the power system 430 will be described more fully below. As described herein, "electronically coupling" or "electronically coupled" means electrically coupled together (e.g., for power coupling), communicatively coupled together (e.g., for sensor data communication), or both electrically coupled and communicatively coupled together.

The electric motor 432 may include many configurations capable of providing a motive force to at least one wheel of the micromobility transit vehicle 400. For example, the electric motor 432 may be a 3-phase motor designed to run on three-phase alternating current (AC) power. In such embodiments, the electric motor 432 may include a rotor and a stator, with the stator including three pairs of coils spaced around the rotor. Each pair of coils of the electric motor 432 may be attached to a respective phase of power to set up a rotating magnetic field that spins around the stator. The moving magnetic field creates a continuously moving and out-of-sync current in the rotor that causes the rotor to continuously rotate as the rotor chases the moving magnetic field of the stator. Depending on the application, one of the stator and rotor may be coupled to or define at least a portion of a stationary portion of the micromobility transit vehicle 400 and the other of the stator and rotor may be coupled to or define at least a portion of a movable portion of the micromobility transit vehicle 400 such that relative movement between the rotor and stator causes movement of the micromobility transit vehicle 400.

As shown, the electric motor 432 may be associated with the rear wheel 410 of the micromobility transit vehicle 400 such that operation of the electric motor 432 causes rotation of the rear wheel 410 to propel the micromobility transit vehicle 400 across a surface. Depending on the application, the electric motor 432 may be integrated with the rear wheel 410 of the micromobility transit vehicle 400. For example, at least a portion of the electric motor 432 may define a portion of the rear wheel 410, such as the rotor defining at least a portion of the hub of the rear wheel 410, although other configurations are contemplated. In such embodiments, the stator may define at least a portion of the axle of the rear wheel 410. In some embodiments, the electric motor 432 may be coupled to the rear wheel 410 via gearing, a chain drive, or other mechanical linkages.

The electric motor 432 may be electronically coupled to the motor controller 434 in many configurations. For instance, the electric motor 432 may be connected to the motor controller 434 through one or more motor cables 446 routed from the motor controller 434 to the electric motor 432. The one or more motor cables 446 may be routed along and/or through the frame 402. For example, the one or more motor cables 446 may be routed along and/or through the rear fork and one of the first frame member 416 and the second frame member 418 (e.g., the first frame member 416) to electronically couple the electric motor 432 to the motor controller 434.

The brake resistor 438 may be configured to produce a braking torque or dynamic braking on the electric motor 432 through electrical resistance, thereby decelerating the electric motor 432 as desired. The braking torque may be created through consumption or absorption of kinetic energy within the system. For instance, the brake resistor 438 may transform kinetic energy of the electric motor 432 into electrical energy or thermal energy through one or more resistors. Depending on the application, the dynamic braking provided by the brake resistor 438 may be rheostatic or regenerative. In rheostatic applications, the consumed energy may be dissipated as heat through one or more rheostatic resistors. In regenerative applications, electrical power may be fed back into the system, such as to recharge the battery 436, one or more capacitors, or the like.

In some embodiments, the dynamic braking provided by the brake resistor 438 may be controlled by the motor controller 434. For instance, depending on environment, vehicle status, and/or directives received by the motor controller 434, the motor controller 434 may control the level of dynamic braking applied to the electric motor 432 during use. As one example, by controlling the level of dynamic braking applied to the electric motor 432 by the brake resistor 438, the motor controller 434 can control one or more characteristics of the speed, acceleration, deceleration, and/or traction of the micromobility transit vehicle 400, such as limiting a top speed, acceleration, and/or undesired movement of the micromobility transit vehicle 400. In some embodiments, the brake resistor 438 may be used to aid or replace traditional friction brake systems, such as increasing the overall braking force provide by a brake system of the micromobility transit vehicle 400.

As shown, the brake resistor 438 may be disposed at least partially within the vehicle frame space 422 between the first frame member 416 and the second frame member 418. For example, the brake resistor 438 may be positioned within the vehicle frame space 422 and adjacent to the head tube 424 of the frame 402, such as between the head tube 424 and the battery 436. The brake resistor 438 may be electronically coupled to the motor controller 434 through one or more brake resistor cables 448 routed from the motor controller 434 to the brake resistor 438. Like the one or more motor cables 446, the one or more brake resistor cables 448 may be routed along and/or through the frame 402, such as along and/or through one of the first frame member 416 and the second frame member 418 (e.g., the second frame member 418), to electronically couple the brake resistor 438 to the motor controller 434.

The battery 436 may include many configurations configured to provide electrical power to the electric motor 432. For instance, the battery 436 may include any number or combination of batteries, capacitors, electrical generators, cells, AC power sources, or DC power sources, among others, to provide electrical power to the electric motor 432. In some embodiments, the battery 436 may be similar to the battery 124, described above. For instance, the battery 436 may be a lithium-ion battery, nickel-cadmium battery, a nickel-metal hydride battery, or a lead acid battery, among others. The battery 436 may be selected to satisfy one or more requirements of the power system 430 and/or micromobility transit vehicle 400. For example, the battery 436 may be selected to provide a desired power output, power characteristic, weight, size, or any combination thereof.

Like the brake resistor 438, the battery 436 may be disposed at least partially within the vehicle frame space 422 between the first frame member 416 and the second frame member 418. As shown, the battery 436 may be positioned within the vehicle frame space 422 between the brake resistor 438 and the motor controller 434, although other configurations are contemplated. In some embodiments, the battery 436 may at least partially define a footboard of the micromobility transit vehicle 400 on which an operator of the micromobility transit vehicle 400 stands or places their feet during vehicle operation. The battery 436 may be electronically coupled to the motor controller 434 through one or more battery cables 452 routed from the motor controller 434 to the battery 436. The one or more battery cables 452 may be routed along and/or through the frame 402, such as along and/or through one or the first frame member 416 and the second frame member 418 (e.g., the second frame member 418), to electronically couple the battery 436 to the motor controller 434.

The motor controller 434 may include many configurations operable to control a motive force provided by the electric motor 432 to the rear wheel 410. For instance, the motor controller 434 may include one or more circuitries for starting and stopping the electric motor 432, selecting forward or reverse rotation of the electric motor 432, selecting and regulating the speed of the electric motor 432, regulating or limiting the torque supplied by the electric motor 432, and/or protecting against overloads and faults, among others. In some embodiments, the motor controller 434 may include one or more microprocessors or logic devices to intelligently monitor and control the electric motor 432 and/or other components of the power system 430 (e.g., the brake resistor 438, the battery 436, etc.). In some embodiments, the motor controller 434's operational control of the electric motor 432 may be based at least on one or more characteristics of the power system 430 and various contextual control signals and sensor data. For example, the motor controller 434 may control operation of the electric motor 432 based at least on a status of the battery 436, a location of the micromobility transit vehicle 400, locale regulations, user input, or the like.

Like the brake resistor 438 and battery 436, the motor controller 434 may be disposed at least partially within the vehicle frame space 422 between the first frame member 416 and the second frame member 418. In some embodiments, the motor controller 434 may be positioned within the vehicle frame space 422 adjacent to the battery 436, such as between the battery 436 and the rear wheel 410. In some embodiments, the motor controller 434 may be positioned adjacent to the battery 436 on a side opposite of the brake resistor 438. In this manner, the motor controller 434 may be positioned within a rear portion of the micromobility transit vehicle 400. In some embodiments, the motor controller 434 may be located near (e.g., as close as possible to) the electric motor 432 to reduce inductive losses from the high frequency switching that drives the electric motor 432. In addition to being electronically coupled to the electric motor 432, battery 436, and brake resistor 438 (if equipped), the motor controller 434 may be electronically coupled to an electronic control unit (ECU) configured to control one or more electrical systems or subsystems of the micromobility transit vehicle 400. In such embodiments, the motor controller 434 may be electronically coupled to the ECU through a signal harness 454 routed along and/or through the frame 402.

Figure 5:
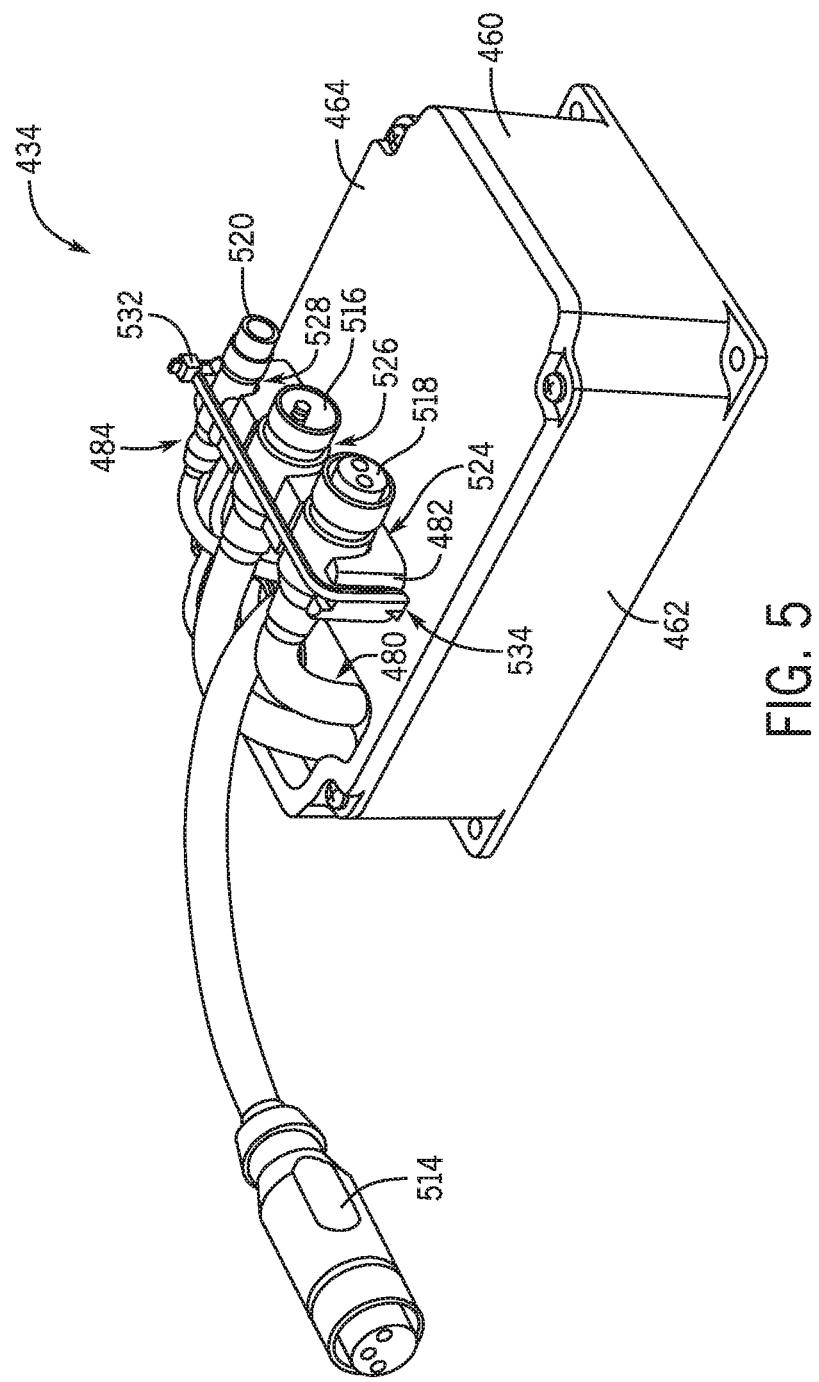
FIG. 5 illustrates a diagram of a motor controller for a micromobility transit vehicle in accordance with an embodiment of the disclosure.
Figure 6:
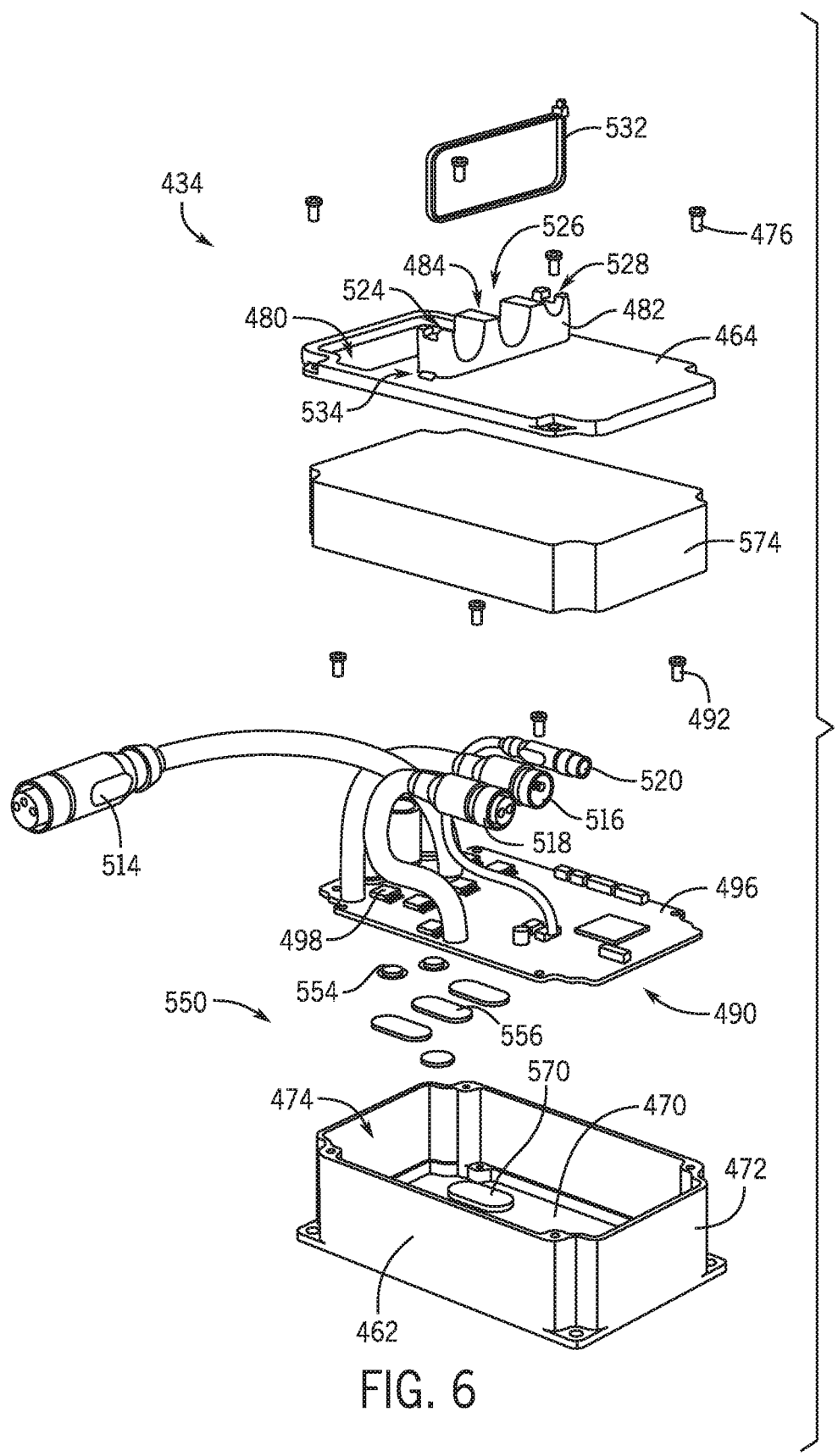
FIG. 6 illustrates a diagram of an architecture for the motor controller of FIG. 5 in accordance with an embodiment of the disclosure.
Figure 7:
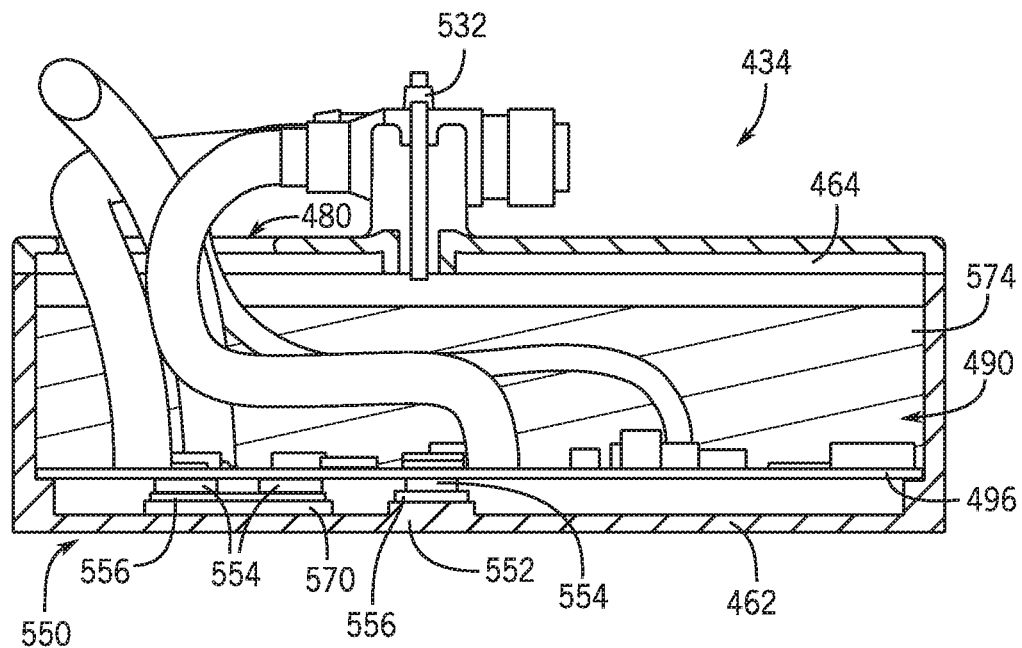
FIG. 7 illustrates a cross-sectional view of the motor controller of FIG. 5 in accordance with an embodiment of the disclosure.

FIG. 5 illustrates a diagram of the motor controller 434 in accordance with an embodiment of the disclosure. FIG. 6 illustrates a diagram of an architecture for the motor controller 434 in accordance with an embodiment of the disclosure. FIG. 7 illustrates a cross-sectional view of the motor controller 434 in accordance with an embodiment of the disclosure. Referring to FIGS. 5-7, the motor controller 434 may include a plurality of components, modules, or assemblies assembled together as a unit. For example, the motor controller 434 may include an enclosure 460 defined by a casing 462 and a lid 464 attached to the casing 462. As best illustrated in FIG. 6, the casing 462 may be defined by a bottom wall 470 and a side wall 472 extending from the bottom wall 470 to define an interior compartment 474. In such embodiments, the lid 464 may be attached to the side wall 472 of the casing 462, such as via one or more mechanical fasteners 476, to enclose one or more components of the motor controller 434 within the enclosure 460. As shown, the lid 464 may include an opening 480 and a holder 482 defined adjacent to the opening 480, the holder 482 having one or more notches 484 to accommodate and/or secure other components of the motor controller 434. For example, the holder 482 may extend from the top of the lid 464 adjacent to the opening 480. In some embodiments, the notches 484 may be labeled for ease of assembly and/or servicing. As explained more fully below, one or more connectors may extend through the opening 480 for attachment to the lid 464 via the notches 484 of the holder 482.

Referring to FIGS. 6 and 7, the motor controller 434 may include one or more components, modules, or assemblies positioned within the enclosure 460 (e.g., within the interior compartment 474 of the casing 462). For instance, the motor controller 434 may include a printed circuit board assembly (PCBA) 490 with various chipsets, electronics, circuitries, and connectors, the PCBA 490 secured to the casing 462 within the interior compartment 474 of the enclosure 460, such as via one or more mechanical fasteners 492. As shown, the PCBA 490 includes a printed circuit board (PCB) 496, one or more (e.g., a plurality of) metal-oxide-semiconductor field-effect transistors (MOSFETs) 498 attached to the PCB 496, and an aperture 500 defined through the PCB 496 below each MOSFET 498 (see FIG. 8), although other configurations are contemplated. For example, the PCBA 490 may include other components and circuitry in addition to or in lieu of the one or more MOSFETs 498. The MOSFETs 498 may be associated with a control of the electric motor 432 and/or the brake resistor 438. For instance, one or more MOSFETs 498 may be configured to control each phase of the electric motor 432. In some embodiments, at least one of the MOSFETs 498 may be configured to control the brake resistor 438. Each aperture 500 of the PCB 496 may be a vertical interconnect access (VIA) defining an electrical connection through the PCB 496. The aperture 500 may be defined by a ring of metal extending through the PCB 496 below each MOSFET 498, by plating the aperture 500 with a metal material, or the like (hereinafter "metal ring" 508 for sake of convenience without intent to limit). Depending on the application, the metal ring 508 may be formed from a copper alloy. As shown in FIG. 7, the lid 464 may enclose the PCBA 490 within the casing 462.

In some embodiments, the motor controller 434 may include one or more connectors attached to the PCBA 490 and extending through the opening 480, with at least some of the one or more connectors attached to a respective notch of the one or more notches 484. For instance, the motor controller 434 may include a motor connector 514, a battery connector 516, a brake resistor connector 518, and a signal connector 520, or any combination thereof. In such embodiments, the motor connector 514 may be connectable to the electric motor 432 and/or to the one or more motor cables 446 to electronically couple the motor controller 434 to the electric motor 432. The battery connector 516 may be connectable to the battery 436 and/or to the one or more battery cables 452 to electronically couple the motor controller 434 to the battery 436. The brake resistor connector 518 may be connectable to the brake resistor 438 and/or to the one or more brake resistor cables 448 to electronically couple the motor controller 434 to the brake resistor 438. The signal connector 520 may be connectable to the signal harness 454 to electronically couple the motor controller 434 to the ECU.

In some embodiments, at least some of the connectors may be secured within the notches 484 of the lid 464. For instance, the brake resistor connector 518 may be secured within a first notch 524 of the lid 464, the battery connector 516 may be secured within a second notch 526 of the lid 464, and the signal connector 520 may be secured within a third notch 528 of the lid 464. In such embodiments, the motor connector 514 may not be attached to the lid 464. To secure the connectors within the notches 484 of the lid 464, each connector may be placed within a respective notch and an attachment element 532 may secure the connectors within the notches 484. The attachment element 532, which may be a cable zip tie or the like, may wrap around the connectors and the holder 482 to secure the connectors in place. For instance, the attachment element 532 may extend around the connectors and through a pair of apertures 534 defined through the lid 464 adjacent to the holder 482 to limit removal of the connectors from the notches 484.

Figure 8:
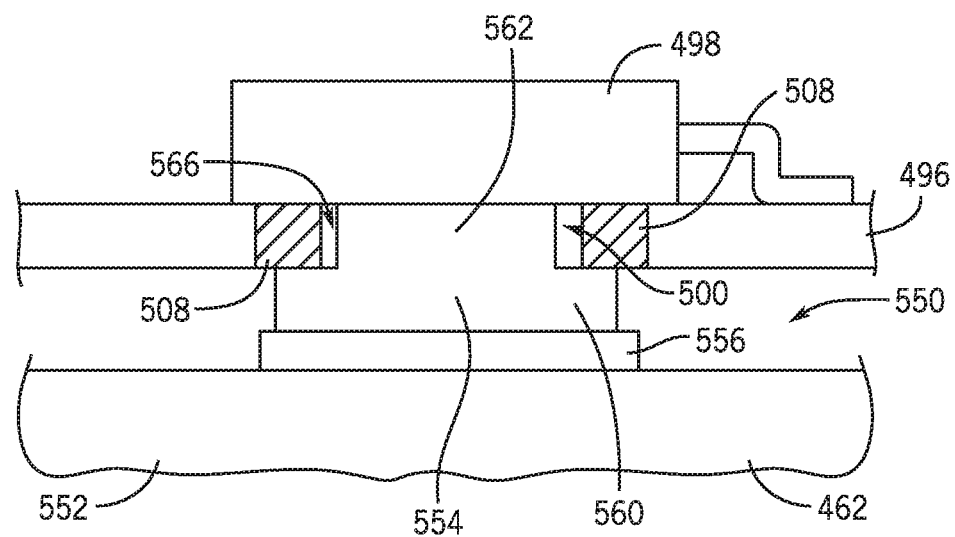
FIG. 8 illustrates an enlarged, fragmentary cross-sectional view of a thermal assembly of the motor controller of FIG. 5 in accordance with an embodiment of the disclosure.

FIG. 8 illustrates an enlarged, fragmentary cross-sectional view of a thermal assembly of the motor controller 434 in accordance with an embodiment of the disclosure. Referring to FIGS. 6-8, the motor controller 434 includes a thermal assembly 550 configured to dissipate heat from one or more heat generating components of the PCBA 490 to a heat sink 552. Each thermal assembly 550 may include a heat transfer plug 554 and a thermal interface material (TIM) 556 positioned between the heat transfer plug 554 and the heat sink 552. In some embodiments, the heat transfer plug 554 and TIM 556 may dissipate heat from the MOSFET 498 to the heat sink 552, as explained below. Although heat dissipation is described with respect to the MOSFET 498, the concepts may be applied to other components of the PCBA 490, such as bipolar transistors, power switches, IGBT transistors, or other component that generates heat during operation.

Depending on the application, the heat sink 552 may include the casing 462 of the enclosure 460, in which case the casing 462 is formed from thermally conductive material, such as aluminum or other metal. In some embodiments, the heat sink 552 may include the frame 402 of the micromobility transit vehicle 400. For instance, the enclosure 460 (i.e., the casing 462) may be secured to the frame 402 such that heat generated by or within the motor controller 434 (e.g., by the MOSFETs 498) is dissipated through the frame 402 of the micromobility transit vehicle 400 via the thermal assembly 550 (i.e., via the heat transfer plug 554 and TIM 556). In some embodiments, the casing 462 may be secured to a metal subframe assembly, the subframe assembly welded or otherwise attached to the first frame member 416 and the second frame member 418 to provide a large thermal mass into which heat from the motor controller 434 may be sinked.

The heat transfer plug 554 may be capable of dissipating heat from an associated MOSFET 498. For example, the heat transfer plug 554 may be positioned at least partially within an associated aperture 500 of the PCB 496 to contact an associated MOSFET 498 (e.g., an underside of the associated MOSFET 498). In such embodiments, heat may be dissipated from the MOSFET 498 to the heat transfer plug 554 through direct contact of the heat transfer plug 554 with the MOSFET 498. In some embodiments, the heat transfer plug 554 may be configured to increase a heat dissipating capacity between the MOSFET 498 and the heat sink 552. For instance, the heat transfer plug 554 may enlarge a heat dissipating conduit or surface to the heat sink 552. As best illustrated in FIG. 8, the heat transfer plug 554 may include a first portion 560 and a second portion 562. The first portion 560 may be a top portion adjacent to the MOSFET 498, and the second portion 562 may be a bottom portion adjacent to the TIM 556. The first portion 560 may have a first diameter greater than a diameter of the associated aperture 500 of the PCB 496, such that the first portion 560 is positioned external to the aperture 500. In such embodiments, the first portion 560 of the heat transfer plug 554 may at least partially contact the PCB 496, such as the metal ring 508 defining the associated aperture 500. In such embodiments, the first portion 560 of the heat transfer plug 554 may be attached at least partially to the metal ring 508, such as soldered to the metal ring 508, as explained below. As shown, the first portion 560 of the heat transfer plug 554 may be attached to the PCB 496 on a side opposite of the MOSFET 498.

With continued reference to FIG. 8, the second portion 562 of the heat transfer plug 554 may have a second diameter less than the diameter of the associated aperture 500 of the PCB 496. In this manner, the second portion 562 may be positioned within the associated aperture 500 of the PCB 496 (e.g., extending through the aperture 500) to at least partially contact the associated MOSFET 498. In some embodiments, the second portion 562 may be sized such that a gap 566 is defined between the second portion 562 of the heat transfer plug 554 and the surface of the metal ring 508 defining the associated aperture 500 of the PCB 496 to allow for component tolerances. In some embodiments, the second diameter of the second portion 562 may be less than a diameter of the associated MOSFET 498 to allow the associated MOSFET 498 to be attached (e.g., soldered) to the PCB 496.

Depending on the application, each of the first portion 560 and the second portion 562 of the heat transfer plug 554 may be cylindrically-shaped. For example, the first portion 560 may define a first disc or first cylindrical portion, and the second portion 562 may define a second disc or second cylindrical portion. The second disc may be smaller in diameter than the first disc. In such embodiments, the heat transfer plug 554 may have a stacked cylinder, mushroom-like, and/or toadstool-like shape, with the smaller second disc stacked on top of the larger first disc, although other configurations are contemplated. Like the metal ring 508, the heat transfer plug 554 may be formed from a copper alloy. In some embodiments, the heat transfer plug 554 may be formed from the same material as the metal ring 508, which may increase reliability of the interface between the heat transfer plug 554 and the metal ring 508. In some embodiments, the heat transfer plug 554 may be formed from plated copper alloy, such as a tin-plated copper alloy, an electroless nickel immersion gold (ENIG) plating, or the like.

The thermal interface material (TIM) 556 may be an electrically insulating, thermally conductive layer of material positioned between the heat transfer plug 554 and the heat sink 552 (e.g., the casing 462). In this manner, the TIM 556 may be capable of dissipating heat from the heat transfer plug 554 to the heat sink 552. For example, during active use of the micromobility transit vehicle 400, heat generated in the MOSFET 498 will be pulled from the MOSFET 498, through the heat transfer plug 554, across the TIM 556, and into the heat sink 552. In addition, any electrical charge of the MOSFET 498 may be isolated from the heat sink 552 via the TIM 556. The TIM 556 may be any suitable material that electrically isolates the heat transfer plug 554 from the casing 462 and thermally conducts heat from heat transfer plug 554 to the casing 462. For example, the TIM 556 may be a 2-part dispensed material, such as a thermally conductive silicone gap filler material.

In some embodiments, the casing 462 may include one or more surface features 568 for locating the TIM 556 between each heat transfer plug 554 and the casing 462. For instance, as shown in FIGS. 6 and 7, the casing 462 may include one or more raised surfaces 570 to properly locate the TIM 556 during assembly. Although raised surfaces 570 are shown, the casing 462 may include other surface features 568 for properly locating the TIM 556, such as one or more depressions, structurally isolated areas, or the like. In this manner, the TIM 556 can sit proud of the bottom wall 470 and/or be placed within depressions formed in the bottom wall 470 to locate the TIM 556 between each heat transfer plug 554 and the casing 462.

Referring to FIGS. 6 and 7, the PCBA 490 may be overmolded in potting material 574 to protect the PCBA 490 from contamination. For example, the potting material 574 may provide water ingress protection, such as an IP67 rating. The potting material 574 may be dispensed within the interior compartment 474 of the motor controller 434 through the opening 480 of the lid 464. Depending on the application, the potting material 574 may fill the interior compartment 474 of the casing 462 until the potting material 574 is approximately 5 mm from the lid 464. In some embodiments, the potting material 574 may fully encapsulate all components of the PCBA 490. In other embodiments, the potting material 574 may not fully encapsulate one or more components of the PCBA 490, such as one or more capacitors, to allow the components to vent, for example.

Figure 9:
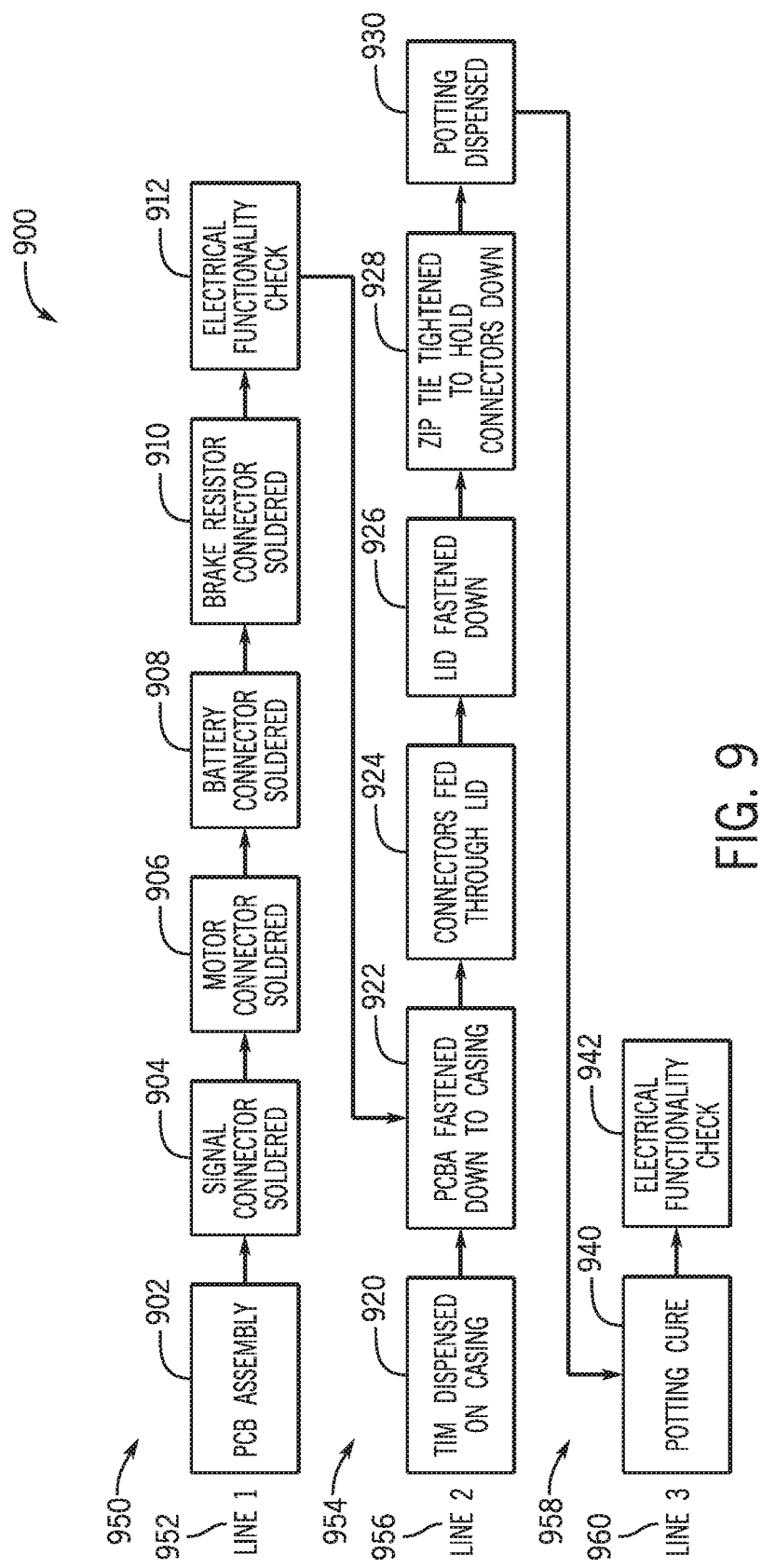
FIG. 9 illustrates a flow diagram of a process of assembling a motor controller in accordance with an embodiment of the disclosure.

FIG. 9 illustrates a flow diagram of a process 900 of assembling a motor controller for a micromobility transit vehicle in accordance with an embodiment of the disclosure. It should be appreciated that any step, sub-step, sub-process, or block of process 900 may be performed in an order or arrangement different from the embodiments illustrated by FIG. 9. For example, one or more blocks may be omitted from or added to the process 900. Although process 900 is described with reference to the embodiments of FIGS. 1-8, process 900 may be applied to other embodiments.

In Block 902, process 900 includes assembling a printed circuit board assembly (PCBA) for a motor controller. The PCBA may be similar to the PCBA 490 of FIGS. 6-8, described above. For example, the PCBA may include a printed circuit board (PCB), one or more metal-oxide-semiconductor field-effect transistors (MOSFETs) attached to the PCB, and an aperture defined through the PCB below each MOSFET. The PCBA may also include other chipsets, electronics, circuitries, connectors, and/or components. For instance, a thermal assembly may be associated with each MOSFET of the PCBA, the thermal assembly including a heat transfer plug positioned at least partially within an associated aperture of the PCBA to contact an associated MOSFET. The heat transfer plug, which may be similar to the heat transfer plug 554 described above, may be soldered to the PCB. For example, a second disc portion may be positioned within an associated aperture, and a first disc portion of the heat transfer plug may be soldered to the bottom of the PCB. Each MOSFET may be soldered to the PCB above an associated aperture. In some embodiments, the MOSFET may be soldered to the heat transfer plug. As described above, each aperture may be defined by a metal ring (e.g., a copper alloy ring) extending through the PCB below each MOSFET. The heat transfer plug may be formed from plated copper alloy (e.g., tin-plated copper alloy, ENIG plated, etc.).

In some embodiments, process 900 may include attaching or otherwise connecting one or more connectors to the PCBA. For example, in Block 904, process 900 includes soldering a signal connector to the PCBA. In Block 906, process 900 includes soldering a motor connector to the PCBA. In Block 908, process 900 includes soldering a battery connector to the PCBA. In Block 910, process 900 includes soldering a brake resistor connector to the PCBA. The signal connector, motor connector, battery connector, and brake resistor connector may be similar to the signal connector 520, motor connector 514, battery connector 516, and brake resistor connector 518 described above. For instance, the signal connector may be configured to electronically couple the motor controller to an ECU of the micromobility transit vehicle. Similarly, the motor controller may be configured to electronically couple the motor controller to an electric motor of the micromobility transit vehicle, the battery connector may be configured to electronically couple the motor controller to a battery of the micromobility transit vehicle, and the brake resistor connector may be configured to electronically couple the motor controller to a brake resistor of the micromobility transit vehicle.

In Block 912, process 900 includes electrically testing the assembled PCBA for functionality and safety before further processing and/or handling. For example, the PCBA may be hooked to electrical power and each MOSFET or group of MOSFETs may be checked using a thermistor across each MOSFET or group of MOSFETs (e.g., per motor grouping, across all MOSFETs, etc.). Other quality control checks for electrical functionality are contemplated. For example, the connections may be checked using x-ray, infrared, or other imaging techniques.

In Block 920, process 900 includes dispensing a thermal interface material (TIM) on a casing of the motor controller. The TIM and casing may be similar to the TIM 556 and casing 462 described above. For example, the TIM may be dispensed on one or more raised surfaces of or within one or more depressions defined in the casing of the motor controller to properly locate the TIM during assembly. The TIM may be any suitable material that electrically isolates the MOSFET/heat transfer plug from the casing and thermally conducts heat from the heat transfer plug to the casing.

In Block 922, the PCBA is fastened down to the casing. For instance, after the electrical functionality check of the PCBA in Block 912 and after dispensing the TIM on the casing in Block 920, the PCBA may be fastened to the casing such that the heat transfer plugs contact the TIM. In Block 922, the TIM has not cured yet and is easily displaced by the placement of the PCBA in the casing, as to not leave residual stresses on the PCBA during its lifetime.

In Block 924, the one or more connectors of the PCBA are fed through a lid of the motor controller. For example, each of the signal connector, motor connector, battery connector, and brake resistor connector may be fed through an opening defined in the lid. The lid may be similar to the lid 464 described above. In Block 926, the lid may be fastened to the casing. For instance, the lid may be fastened to a side wall of the casing via one or more mechanical fasteners to enclose the PCBA within the motor controller.

In Block 928, one or more connectors extending through the opening of the lid may be secured to a holder. For example, the signal connector, battery connector, and brake resistor connector may be placed within respective notches of the holder, and an attachment element may secure the connectors to the holder. Depending on the application, the attachment element may be a cable zip tie that extends around the connectors, around the holder, and through a pair of apertures defined through the lid adjacent to the holder. In some embodiments, the attachment element may be pre-assembled to the lid before the lid is fastened to the casing in Block 926. The attachment element may be tightened to hold the connectors in place and reduce vibrations and noise during operation of the micromobility transit vehicle.

In Block 930, potting may be dispensed in the motor controller to seal off the PCB and other components of the PCBA, such as for an IP67 rating. For example, the potting may be dispensed through the opening of the lid to fill the casing. Depending on the application, the potting may completely fill the casing, or the potting may be dispensed until it is spaced a desired distance (e.g., approximately 5 mm) from the lid. Not fully filling the casing with potting may remove any requirement of the lid sealing to the casing to keep the potting contained during cure. In Block 940, the potting may be cured. For example, the potting may cure under ambient conditions or curing of the potting may be accelerated (e.g., via heating).

In Block 942, process 900 includes electrically testing the assembled motor controller for functionality and safety before final packaging. For example, the assembled motor controller may be connected to a test apparatus simulating power and instructions/commands sent to the motor controller (e.g., via the battery connector and signal connector) and monitoring the output of the motor controller (e.g., via the motor connector and the brake resistor connector). If the assembled motor controller passes the electrical functional check, the motor controller may be sent to packaging or otherwise identified for use in a micromobility transit vehicle.

In some embodiments, one or more blocks of process 900 may occur on a respective assembly line. For example, a first plurality of assembly steps 950 may occur on a first assembly line 952 and a second plurality of assembly steps 954 may occur on a second assembly line 956. In some embodiments, a third plurality of assembly steps 958 may occur on a third assembly line 960, and so forth. As shown in FIG. 9, Blocks 902-912 may occur on the first assembly line 952, Blocks 920-930 may occur on the second assembly line 956, and Blocks 940-942 may occur on the third assembly line 960, although other configurations are contemplated. In such embodiments, the first assembly line 952 may perform a first assembly operation or procedure, the second assembly line 956 may perform a second assembly operation or procedure, and the third assembly line 960 may perform a third assembly operation or procedure. In this manner, the assembly lines may operate independent from one another.

The second assembly line 956 may be adjacent to the first assembly line 952 to allow efficient transfer of the PCBA to the second assembly line 956 after the electrical functionality check of the PCBA in Block 912. Similarly, the third assembly line 960 may be adjacent to the second assembly line 956 to allow efficient transfer of the motor controller to the third assembly line 960 after potting is dispensed in the motor controller in Block 930. Although the assembly lines may be positioned physically adjacent to one another, in some embodiments, the assembly lines may be connected to one another through one or more conveyor beds, belts, or systems.

Figure 10:
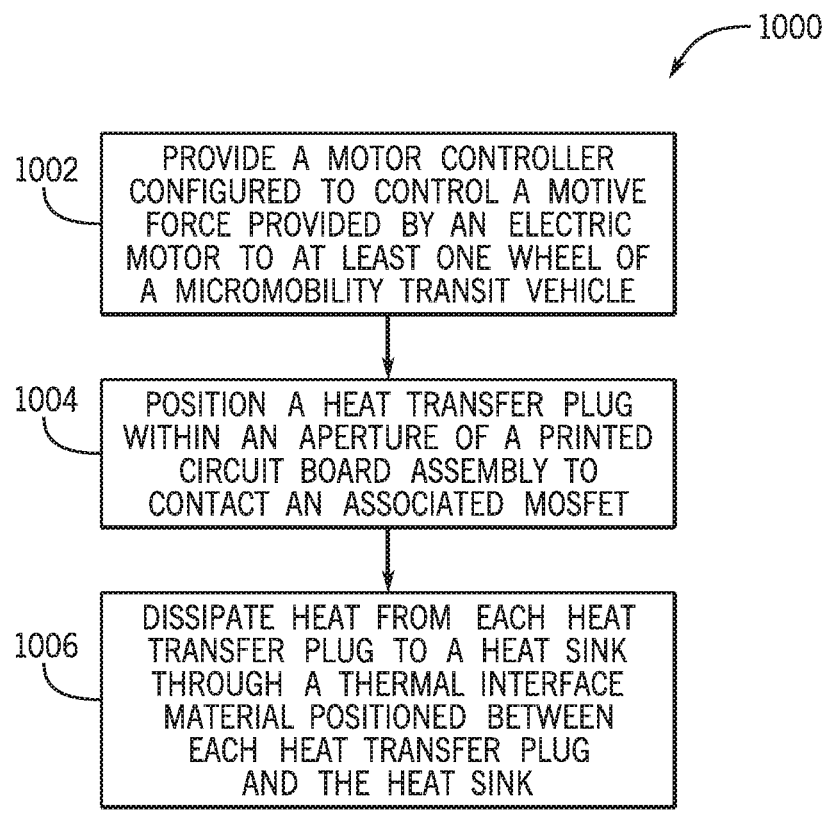
FIG. 10 illustrates a flow diagram of a process of dissipating heat from one or more MOSFETs of a motor controller in accordance with an embodiment of the disclosure.

FIG. 10 illustrates a flow diagram of a process 1000 of dissipating heat from one or more MOSFETs of a motor controller for a micromobility transit vehicle in accordance with an embodiment of the disclosure. It should be appreciated that any step, sub-step, sub-process, or block of process 1000 may be performed in an order or arrangement different from the embodiments illustrated by FIG. 10. For example, one or more blocks may be omitted from or added to the process 1000. Although process 1000 is described with reference to the embodiments of FIGS. 1-9, process 1000 may be applied to other embodiments.

In Block 1002, process 1000 includes providing a motor controller configured to control a motive force provided by an electric motor to at least one wheel of a micromobility transit vehicle. The motor controller, electric motor, and micromobility transit vehicle may be similar to the motor controller 434, electric motor 432, and micromobility transit vehicle 400 of FIGS. 4-8, described above. For instance, the motor controller may include a printed circuit board assembly (PCBA) including a printed circuit board (PCB), one or more metal-oxide-semiconductor field-effect transistors (MOSFETs) attached to the PCB, and an aperture defined through the PCB below each MOSFET. In some embodiments, the motor controller may include a casing having an interior compartment, the PCBA positioned within the interior compartment and connected to the casing. The motor controller, or at least portions of the motor controller, may be assembled similar to process 900 illustrated in FIG. 9 and described above.

In Block 1004, process 1000 includes positioning a heat transfer plug at least partially within each aperture of the PCBA to contact an associated MOSFET. The heat transfer plug may be similar to the heat transfer plug 554 of FIGS. 4-8, described above. For example, the heat transfer plug may include first and second portions defining a stacked cylinder shape with a smaller second disc stacked on top of a larger first disc. The first portion of the heat transfer plug may be positioned against the PCB. The second portion of the heat transfer plug may be positioned within the aperture of the PCBA to contact the associated MOSFET.

In Block 1006, process 1000 includes dissipating heat from each heat transfer plug to a heat sink through a thermal interface material (TIM) positioned between each heat transfer plug and the heat sink. For example, heat may be dissipated through the TIM from each heat transfer plug to the casing of the motor controller. In such embodiments, the heat dissipated to the casing may be dissipated to a frame of the micromobility transit vehicle. For example, heat may be dissipated from the casing of the motor controller to a subframe assembly of the frame. The subframe assembly may be sized to provide a large thermal mass to receive the heat dissipated from the motor controller. The TIM may be similar to the TIM 556 of FIGS. 6-8, described above.

Where applicable, various embodiments provided by the present disclosure can be implemented using hardware, software, or combinations of hardware and software. Also, where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A micromobility transit vehicle comprising:
a motor controller comprising:
   a printed circuit board (PCB) having an aperture defined by a metal ring;
   a metal-oxide-semiconductor field-effect transistor (MOSFET) attached to the PCB above the aperture of the PCB;
   a heat transfer plug having a first portion positioned on a side of the PCB opposite of the MOSFET and a second portion positioned at least partially within the aperture of the PCB to contact the MOSFET, wherein heat dissipates from the MOSFET to the heat transfer plug through direct contact of the heat transfer plug with the MOSFET, wherein the first portion of the heat transfer plug (1) at least partially contacts the metal ring and (2) does not contact the PCB, and wherein the second portion of the heat transfer plug has a diameter such that an air gap is formed between the second portion and the metal ring when the second portion is within the aperture;
   a heat sink; and
   a thermal interface material (TIM) positioned between the heat transfer plug and the heat sink, wherein the TIM is configured to dissipate heat from the heat transfer plug to the heat sink.

2. The micromobility transit vehicle of claim 1, wherein the heat transfer plug comprises:
the first portion positioned external to the aperture, the first portion having a first diameter greater than a diameter of the aperture of the PCB; and
the second portion extending within the aperture, the second portion having a second diameter less than the diameter of the aperture of the PCB to define the air gap between the PCB and the second portion of the heat transfer plug within the aperture.

3. The micromobility transit vehicle of claim 1, further comprising:
a frame;
at least one wheel; and
an electric motor associated with the at least one wheel, wherein the motor controller is configured to control a motive force provided by the electric motor to the at least one wheel, and
wherein heat dissipates from the heat sink to the frame of the micromobility transit vehicle.

4. The micromobility transit vehicle of claim 1, wherein a first diameter of the first portion of the heat transfer plug is greater than an inner diameter of the metal ring and less than an outer diameter of the metal ring.

5. The micromobility transit vehicle of claim 1, wherein:
the motor controller comprises a casing that defines an interior compartment;
the PCB is disposed within the casing; and
a potting material fills at least a portion of the interior compartment.

6. The micromobility transit vehicle of claim 5, wherein the potting material fully encapsulates all components of the PCB.

7. The micromobility transit vehicle of claim 5, wherein the potting material does not fully encapsulate one or more components of the PCB.

8. A motor controller configured to control a motive force provided by an electric motor to at least one wheel of a micromobility transit vehicle, the motor controller comprising:
a printed circuit board (PCB) having a first side and an opposing second side, the PCB having an aperture defined by a metal ring;
a metal-oxide-semiconductor field-effect transistor (MOSFET) attached to the first side of the PCB above the aperture of the PCB;
a heat transfer plug having a first portion positioned on a side of the PCB opposite of the MOSFET and a second portion at least partially attached to the second side of the PCB and extending through the aperture to contact the MOSFET, wherein the first portion of the heat transfer plug (1) at least partially contacts the metal ring and (2) does not contact the PCB, and wherein the second portion of the heat transfer plug has a diameter such that an air gap is formed between the second portion and the metal ring when the second portion is within the aperture;
a heat sink; and
a thermal interface material (TIM) positioned between the heat transfer plug and the heat sink, wherein the TIM is configured to dissipate heat from the heat transfer plug to the heat sink.

9. The motor controller of claim 8, further comprising a casing, wherein the PCB is received within the casing, wherein the heat transfer plug and the TIM dissipate heat from the MOSFET to the casing, and wherein the TIM electrically isolates the heat transfer plug from the casing.

10. The motor controller of claim 9, wherein the casing comprises one or more surface features for locating the TIM between the heat transfer plug and the casing.

11. The motor controller of claim 10, wherein the one or more surface features comprise one or more raised surfaces defined in the casing, the TIM positioned at least partially on the one or more raised surfaces to locate the TIM between the heat transfer plug and the casing.

12. The motor controller of claim 9, further comprising:
a lid attached to the casing that encloses the PCB within the casing, the lid comprising an opening and one or more notches within a holder defined adjacent to the opening;
one or more connectors attached to the PCB and extending through the opening and attached to a respective notch of the one or more notches of the holder; and
an attachment element securing the one or more connectors within the one or more notches of the holder.

13. The motor controller of claim 8, wherein the heat transfer plug is configured to increase a heat dissipating capacity between the MOSFET and the heat sink by enlarging a heat dissipating conduit or surface to the heat sink.

14. The motor controller of claim 13, wherein the heat transfer plug comprises a stacked cylinder shape with a first cylindrical portion having a first diameter greater than a diameter of the aperture such that the first cylindrical portion contacts the PCB, and a second cylindrical portion having a second diameter less than the diameter of the aperture such that the second cylindrical portion extends through the aperture to contact the MOSFET and dissipate heat from the MOSFET to the heat transfer plug.

15. The motor controller of claim 14, wherein the heat transfer plug is formed from a tin-plated copper alloy.

16. The motor controller of claim 8, wherein the MOSFET is configured to control a brake resistor of the micromobility transit vehicle.

17. A method comprising:
providing a motor controller configured to control a motive force provided by an electric motor to at least one wheel of a micromobility transit vehicle, the motor controller comprising a printed circuit board (PCB) having an aperture defined by a metal ring, a metal-oxide-semiconductor field-effect transistor (MOSFET) attached to the PCB above the aperture of the PCB;

positioning a heat transfer plug to have a first portion positioned on a side of the PCB opposite of the MOSFET and a second portion at least partially within the aperture of the PCB to contact the MOSFET, wherein the first portion of the heat transfer plug (1) at least partially contacts the metal ring and (2) does not contact the PCB, and wherein the second portion of the heat transfer plug has a diameter such that an air gap is formed between the second portion and the metal ring when the second portion is within the aperture; and dissipating heat from the heat transfer plug to a heat sink through a thermal interface material (TIM) positioned between the heat transfer plug and the heat sink.

18. The method of claim 17, wherein:

the motor controller further comprises a casing having an interior compartment, the PCB positioned within the interior compartment and connected to the casing; and dissipating heat from the heat transfer plug to the heat sink comprises dissipating heat from the heat transfer plug to the casing.

19. The method of claim 18, further comprising dissipating heat from the casing to a frame of the micromobility transit vehicle.

20. The method of claim 17, wherein positioning the heat transfer plug comprises positioning a first cylindrical portion of the heat transfer plug against the PCB and positioning a second cylindrical portion of the heat transfer plug within the aperture to contact the MOSFET.

* * * * *